United States Patent
Kim et al.

(10) Patent No.: US 10,026,909 B2
(45) Date of Patent: Jul. 17, 2018

(54) ANTHRACENE-BASED COMPOUND AND ORGANIC LIGHT-EMITTING DEVICE COMPRISING THE SAME

(71) Applicants: SAMSUNG DISPLAY CO., LTD., Yongin, Gyeonggi-do (KR); Industry-Academic Cooperation Foundation Gyeongsang National University, Gyeongnam (KR)

(72) Inventors: Mi-Kyung Kim, Yongin (KR); Chang-Woong Chu, Yongin (KR); Se-Hun Kim, Yongin (KR); Hwan-Hee Cho, Yongin (KR); Dong-Hyun Kim, Yongin (KR); Yun-Hi Kim, Gyeongnam (KR); Soon-Ki Kwon, Gyeongnam (KR); Yun-Ji Lee, Gyeongnam (KR)

(73) Assignees: SAMSUNG DISPLAY CO., LTD., Yongin, Gyeonggi-do (KR); Industry-Academic Cooperation Foundation Gyeongsang National University, Jinju, Gyeongnam (KR)

( * ) Notice: Subject to any disclaimer, the term of this patent is extended or adjusted under 35 U.S.C. 154(b) by 733 days.

(21) Appl. No.: 14/314,097

(22) Filed: Jun. 25, 2014

(65) Prior Publication Data
US 2015/0053945 A1    Feb. 26, 2015

(30) Foreign Application Priority Data

Aug. 22, 2013 (KR) .................. 10-2013-0099886

(51) Int. Cl.
| | | |
|---|---|---|
| H01L 51/54 | (2006.01) | |
| C09K 11/06 | (2006.01) | |
| H01L 51/00 | (2006.01) | |
| H01L 51/50 | (2006.01) | |

(52) U.S. Cl.
CPC ...... H01L 51/0094 (2013.01); H01L 51/0058 (2013.01); H01L 51/5012 (2013.01)

(58) Field of Classification Search
CPC .. C07F 15/00; C07F 15/0006; C07F 15/0013; C07F 15/002; C07F 15/0026; C07F 15/0033; C07F 15/0046; C07F 15/006; C07F 15/0073; C07F 15/0086; C09K 11/06; C09K 2211/00; C09K 2211/10; C09K 2211/1018; C09K 2211/1025; C09K 2211/1029; C09K 2211/18; C09K 2211/185; C09K 2211/1007; C09K 2211/1037; C09K 2211/188; H05B 33/14; H01L 51/0032; H01L 51/005; H01L 51/0084; H01L 51/0085; H01L 51/0092; H01L 51/50; H01L 51/5012; H01L 51/5016
USPC ...... 428/690, 917, 336, 411.4; 313/502–509; 257/40, 88–104, E51.001–E51.052; 252/301.16–301.35; 546/4
See application file for complete search history.

(56) References Cited

U.S. PATENT DOCUMENTS

| | | | |
|---|---|---|---|
| 2010/0237330 A1* | 9/2010 | Lee | ........................ C09K 11/06 257/40 |
| 2010/0314644 A1* | 12/2010 | Nishimura | .......... H01L 51/5072 257/98 |
| 2014/0054558 A1 | 2/2014 | Kim et al. | |

FOREIGN PATENT DOCUMENTS

| | | | |
|---|---|---|---|
| JP | 2009-40765 A | | 2/2009 |
| JP | 2012-119592 A | | 6/2012 |
| KR | 20080088109 A | * | 10/2008 |
| KR | 10-2014-0026682 A | | 3/2014 |

OTHER PUBLICATIONS

Lyu et al. Adv. Mater. 2008, 20, 2720-2729. Year of publication: 2008.*
Machine translation of KR2008-088109. Date of publicaiton: Oct. 2, 2008.*

* cited by examiner

*Primary Examiner* — Andrew K Bohaty
(74) *Attorney, Agent, or Firm* — Lee & Morse, P.C.

(57) ABSTRACT

An anthracene-based compound is provided as represented by Formula 1:

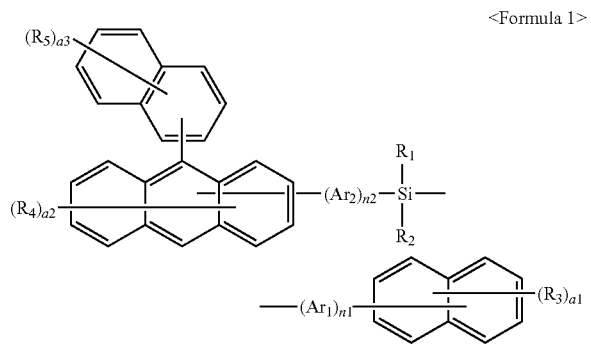

with substituents as described herein.

20 Claims, 3 Drawing Sheets

ANTHRACENE-BASED COMPOUND AND ORGANIC LIGHT-EMITTING DEVICE COMPRISING THE SAME

CROSS-REFERENCE TO RELATED APPLICATION

The present application claims priority under 35 U.S.C. § 119 to Korean Patent Application No. 10-2013-0099886, filed on Aug. 22, 2013, in the Korean Intellectual Property Office, and entitled: "Anthracene-Based Compound and Organic Light-Emitting Device Comprising The Same," which is incorporated by reference herein in its entirety.

BACKGROUND

1. Field

Embodiments relate to an anthracene-based compound and an organic light-emitting device including the anthracene-based compound.

2. Description of the Related Art

Organic light-emitting devices (OLEDs) are self-emitting devices have advantages such as wide viewing angles, excellent contrast, quick responses, high brightness, excellent driving voltage characteristics, and provision of multi-colored images. A typical OLED has a structure including and an anode, a hole transport layer (HTL), an emission layer (EML), an electron transport layer (ETL), and a cathode, which may be sequentially stacked in this order on a substrate. In this regard, the HTL, the EML, and the ETL are organic thin films including one or more organic compounds. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Embodiments are directed to an anthracene-based compound represented by Formula 1:

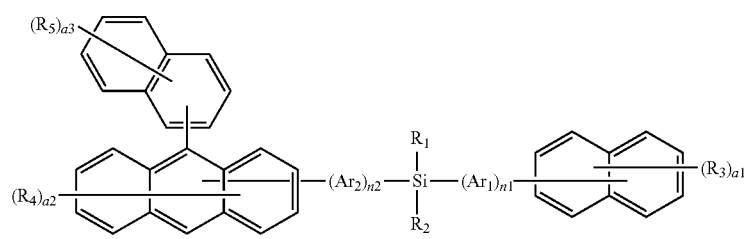

<Formula 1> wherein, in Formula 1, $Ar_1$ and $Ar_2$ are each independently selected from a substituted or unsubstituted $C_3$-$C_{30}$ cycloalkylene group, a substituted or unsubstituted $C_3$-$C_{30}$ cycloalkenylene group, a substituted or unsubstituted $C_6$-$C_{30}$ arylene group, a substituted or unsubstituted $C_1$-$C_{30}$ heterocycloalkylene group, a substituted or unsubstituted $C_1$-$C_{30}$ heterocycloalkenylene group, and a substituted or unsubstituted $C_1$-$C_{30}$ heteroarylene group; n1 and n2 are each independently an integer from 0 to 3; a sum of n1 and n2 is 1 or greater; $R_1$ to $R_5$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_3$-$C_{30}$ cycloalkyl group, a substituted or unsubstituted $C_1$-$C_{30}$ heterocycloalkyl group, a substituted or unsubstituted $C_3$-$C_{30}$ cycloalkenyl group, a substituted or unsubstituted $C_1$-$C_{30}$ heterocycloalkenyl group, a substituted or unsubstituted $C_6$-$C_{30}$ aryl group, and a substituted or unsubstituted $C_1$-$C_{30}$ heteroaryl group; a1 and a3 are each independently an integer from 0 to 7; and a2 is an integer from 0 to 8.

Embodiments are also directed to an organic light-emitting device that includes: a first electrode; a second electrode opposite to the first electrode; and an organic layer between the first and second electrodes and including an emission layer, wherein the organic layer includes at least one anthracene-based compound of Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
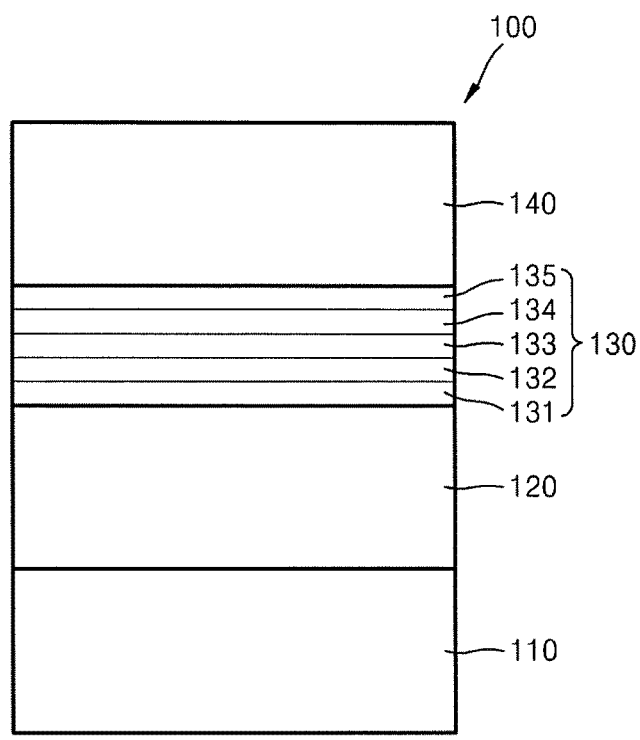
FIG. 1 illustrates a schematic view of a structure of an organic light-emitting device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout. The term "and/or" includes any and all combinations of one or more of the associated listed items. Expressions such as "at least one of," when preceding a list of elements, modify the entire list of elements and do not modify the individual elements of the list.

There is provided an anthracene-based compound represented by Formula 1:

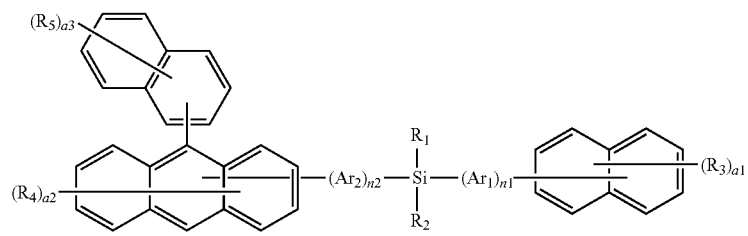

<Formula 1>

In Formula 1, $Ar_1$ and $Ar_2$ may be each independently selected from a substituted or unsubstituted $C_3$-$C_{30}$ cycloalkylene group, a substituted or unsubstituted $C_3$-$C_{30}$ cycloalkenylene group, a substituted or unsubstituted $C_6$-$C_{30}$ arylene group, a substituted or unsubstituted $C_1$-$C_{30}$ heterocycloalkylene group, a substituted or unsubstituted $C_1$-$C_{30}$ heterocycloalkenylene group, and a substituted or unsubstituted $C_1$-$C_{30}$ heteroaryl group.

$Ar_1$ and $Ar_2$ in Formula 1 may be each independently selected, for example, from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spirofluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group.

$Ar_1$ and $Ar_2$ in Formula 1 may be each independently selected, for example, from i) a phenylene group, a naphthylene group, and an anthracenylene group; and ii) a phenylene group, a naphthylene group, and an anthracenylene group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, and a $C_1$-$C_{30}$ alkyl group; a $C_1$-$C_{30}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_6$-$C_{30}$ aryl group and a $C_1$-$C_{30}$ heteroaryl group; and a $C_6$-$C_{30}$ aryl group and a $C_1$-$C_{30}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, and a $C_1$-$C_{30}$ heteroaryl group.

Ar1 and Ar2 in Formula 1 may be each independently selected, for example, from i) a phenylene group, a naphthylene group, and an anthracenylene group; and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group; and a methyl group, an ethyl group, a n-propyl group, an iso-propyl group, a n-butyl group, a sec-butyl group, an iso-butyl group, and a tert-butyl group, each substituted with at least one of a deuterium atom, a halogen atom, a hydroxyl group, a cyano group, and a nitro group.

Ar1 and Ar2 in Formula 1 may be each independently selected, for example, from i) a phenylene group, a naphthylene group, and an anthracenylene group; and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group.

In Formula 1, n1, which indicates the number of Ar1s, may be an integer from 0 to 3 When n1 is an integer of 2 or greater, for example, n1 number of Ar1s may be identical to or different from each other. In Formula 1, n2, which indicates the number of Ar2s, may be an integer from 0 to 3. When n2 is an integer of 2 or greater, for example, n2 number of Ar2s may be identical to or different from each other. For example, n1 and n2 in Formula 1 may be each independently an integer from 0 to 2. Other integers for n1 and n2 may be employed. In Formula 1, a sum of n1 and n2 may be 1 or greater. At least one Ar2 may be between a Si atom and an anthracene ring, or at least one Ar1 may be between an Si atom and a naphthalene ring. For example, n1 in Formula 1 may be an integer of 0, and n2 may be an integer of 1 or 2. Other suitable integers for n1 and n2 may be employed. For example, (Ar1)n1 and (Ar2)n2 in Formula 1 may be each independently one selected from groups represented by Formulae 3-1 to 3-11:

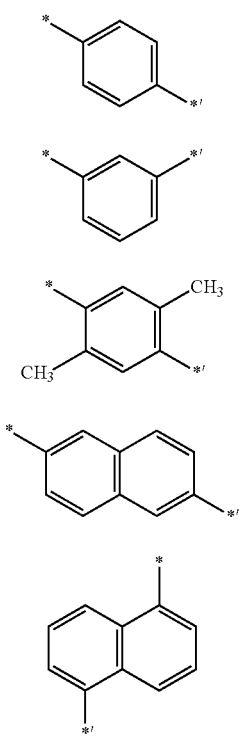

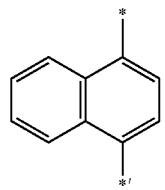

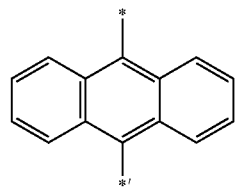

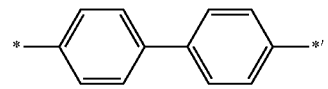

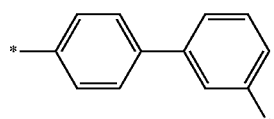

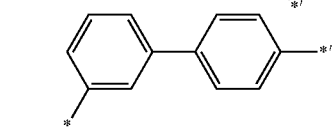

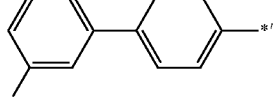

In Formulae 3-1 to 3-11, * indicates a binding site with an anthracene ring, and *' indicates a binding site with a Si atom. For example, R1 to R5 in Formula 1 may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_3$-$C_{30}$ cycloalkyl group, a substituted or unsubstituted $C_1$-$C_{30}$ heterocycloalkyl group, a substituted or unsubstituted $C_3$-$C_{30}$ cycloalkenyl group, a substituted or unsubstituted $C_1$-$C_{30}$ heterocycloalkenyl group, a substituted or unsubstituted $C_6$-$C_{30}$ aryl group, and a substituted or unsubstituted $C_1$-$C_{30}$ heteroaryl group.

For example, R1 and R2 in Formula 1 may be each independently selected from a deuterium atom, a halogen atom, a cyano group, a nitro group, a substituted or unsubstituted methyl group, a substituted or unsubstituted ethyl group, a substituted or unsubstituted n-propyl group, a substituted or unsubstituted i-propyl group, a substituted or unsubstituted n-butyl group, a substituted or unsubstituted iso-butyl group, a substituted or unsubstituted sec-butyl group, a substituted or unsubstituted tert-butyl group, a substituted or unsubstituted pentyl group, a substituted or unsubstituted hexyl group, a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, and a substituted or unsubstituted hexacenyl group.

$R_1$ and $R_2$ in Formula 1 may be each independently selected, for example, from i) a methyl group, an ethyl group, and an n-propyl group; ii) a methyl group, an ethyl group, and an n-propyl group, each substituted with a deuterium atom, a halogen atom, a cyano group, and a nitro group; iii) a phenyl group, a naphthyl group, and an anthryl group; and iv) a phenyl group, a naphthyl group, and an anthryl group, each substituted with at least one of a deuterium atom, a halogen atom, a cyano group, a nitro group, a methyl group, an ethyl group, and an n-butyl group.

$R_1$ and $R_2$ in Formula 1 may be each independently selected, for example, from a methyl group, an ethyl group, a phenyl group, and 2-naphthyl group. $R_3$ to $R_5$ in Formula 1 may be each independently selected, for example, from a hydrogen atom, a deuterium atom, a halogen atom, a hydroxyl group, a cyano group, and a nitro group. In Formula 1, a1, which indicates the number of R3s, may be an integer from 0 to 7. For example, when a1 in Formula 1 is 0, the naphthalene ring is not substituted. In Formula 1, a2, which indicates the number of R4s, may be an integer from 0 to 8. For example, when a2 in Formula 1 is 0, the anthracene ring is not substituted. In Formula 1, a3, which indicates the number of R5s, may be an integer from 0 to 7. For example, when a3 in Formula 1 is 0, the naphthalene ring is not substituted.

The anthracene-based compound of Formula 1 may be a compound represented, for example, by Formula 1a or 1b:

<Formula 1a>

In Formulae 1a and 1b, $Ar_1$ and $Ar_2$ may be each independently selected from i) a phenylene group, a naphthylene group, and an anthracenylene group, and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group; n1 and n2 may be each independently an integer from 0 to 2; a sum of n1 and n2 may be 1 or greater; and $R_1$ and $R_2$ may be each independently selected from i) a methyl group, an ethyl group, and an n-propyl group, ii) a methyl group, an ethyl group, and an n-propyl group, each substituted with a deuterium atom, a halogen atom, a cyano group, and a nitro group, iii) a phenyl group, a naphthyl group, and an anthryl group, and iv) a phenyl group, a naphthyl group, and an anthryl group, each substituted with at least one of a deuterium atom, a halogen atom, a cyano group, a nitro group, a methyl group, an ethyl group, and an n-butyl group; $R_3$ may be selected from a hydrogen atom, a deuterium atom, a halogen atom, a hydroxyl group, a cyano group, and a nitro group; and a1 may be an integer from 0 to 7.

The anthracene-based compound of Formula 1 may be a compound represented by, for example, Formula 1a or 1b:

<Formula 1a>

<Formula 1b>

In Formulae 1a and 1b, $(Ar1)_{n1}$ and $(Ar2)_{n2}$ may be each independently selected from groups represented by Formulae 3-1 to 3-11:

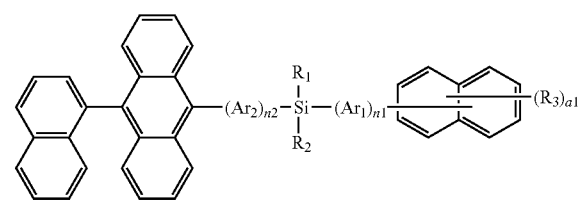

3-1

-continued

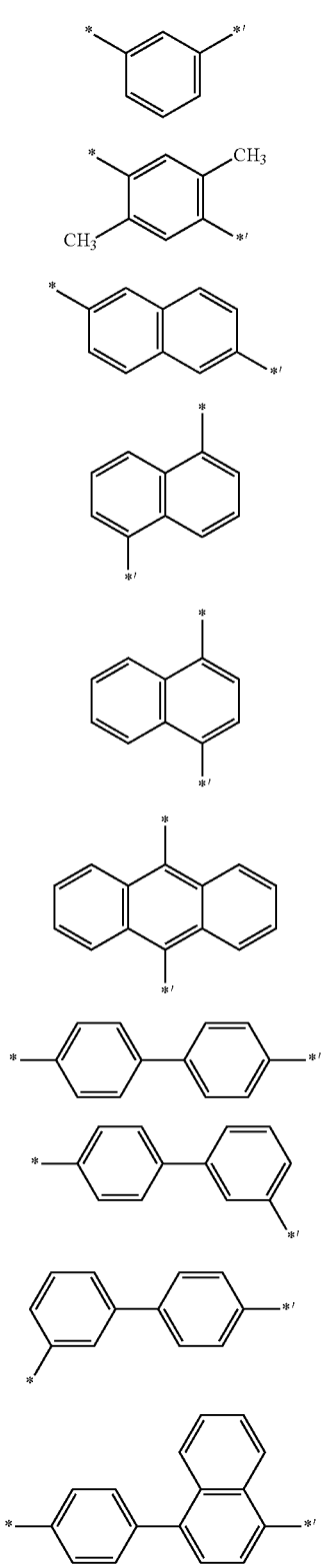

In Formulae 3-1 to 3-11, * indicates a binding site with an anthracene ring, and *' indicates a binding site with a Si atom; $R_1$ and $R_2$ may be each independently selected from a methyl group, an ethyl group, a phenyl group, and a 2-naphthyl group; $R_3$ may be selected from a hydrogen atom, a deuterium atom, a halogen atom, a hydroxyl group, a cyano group, and a nitro group; and a1 may be an integer from 0 to 7.

The anthracene-based compound of Formula 1 may be a compound represented by, for example, one of Formulae 1c to 1f:

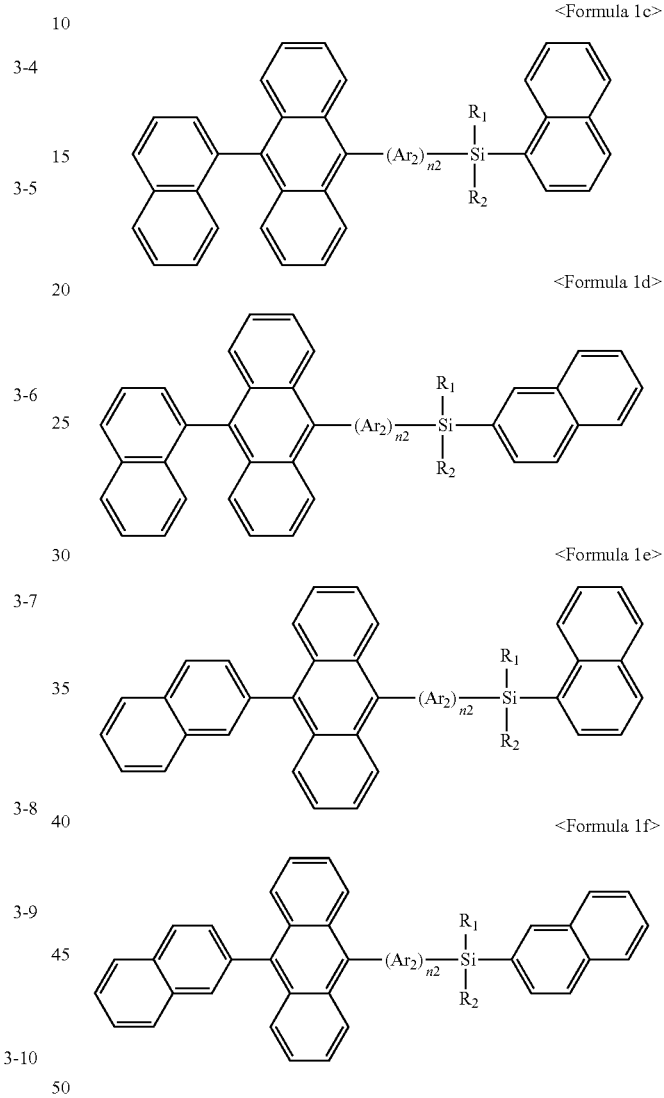

In Formulae 1c to 1f, $Ar_2$ may be selected from i) a phenylene group, a naphthylene group, and an anthracenylene group, and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group; n2 may be an integer of 1 or 2; and $R_1$ and $R_2$ may be each independently selected from i) a methyl group, an ethyl group, and an n-propyl group, ii) a methyl group, an ethyl group, and an n-propyl group, each substituted with a deuterium atom, a halogen atom, a cyano group, and a nitro group, iii) a phenyl group, a naphthyl group, and an anthryl group, and iv) a phenyl group, a naphthyl group, and an anthryl group, each substituted with at least one of a deuterium atom, a halogen atom, a cyano group, a nitro group, a methyl group, an ethyl group, and an n-butyl group.

The anthracene-based compound of Formula 1 may be a compound represented by, for example, one selected from Formulae 1c to 1f:

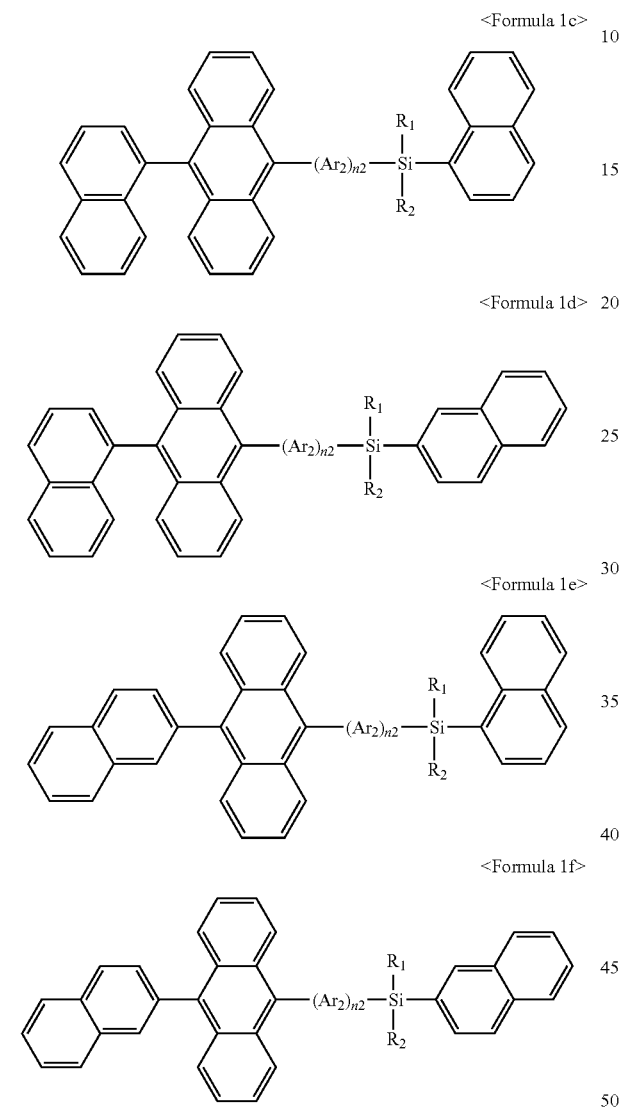

<Formula 1c>

<Formula 1d>

<Formula 1e>

<Formula 1f>

In Formulae 1c to 1f, $(Ar_2)_{n2}$ may be a group represented by one selected from Formulae 3-1 to 3-11:

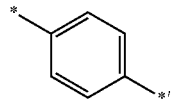

3-1

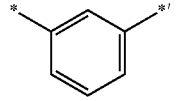

3-2

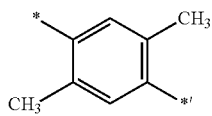

3-3

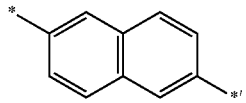

3-4

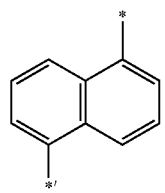

3-5

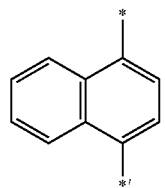

3-6

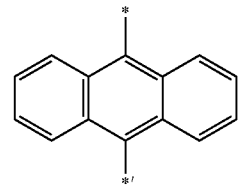

3-7

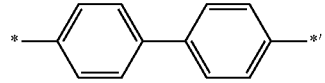

3-8

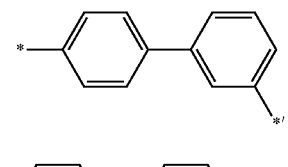

3-9

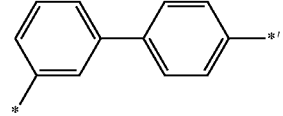

3-10

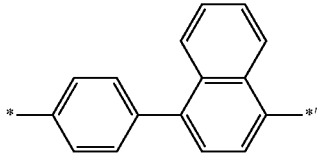

3-11

In Formulae 3-1 to 3-11, * indicates a binding site with an anthracene ring, and *' indicates a binding site with a Si atom; and $R_1$ and $R_2$ may be each independently selected from a methyl group, an ethyl group, a phenyl group, and a 2-naphthyl group. The anthracene-based compound of Formula 1 may be a compound selected from, for example, Compounds 1 to 28:

<Compound 1>
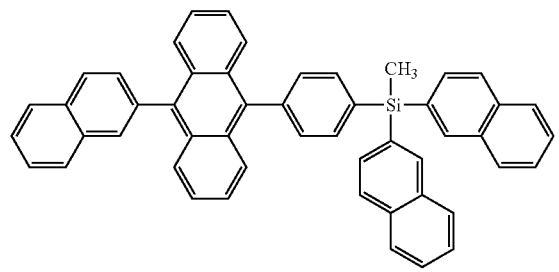
<Compound 2>
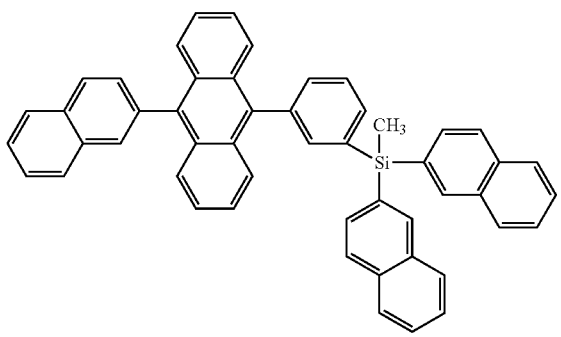
<Compound 3>
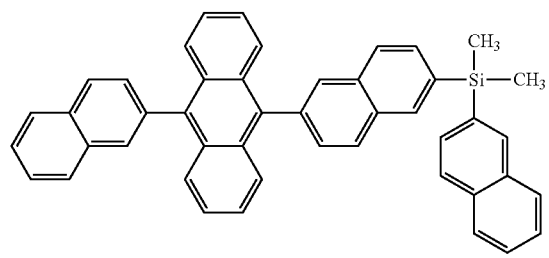
<Compound 4>
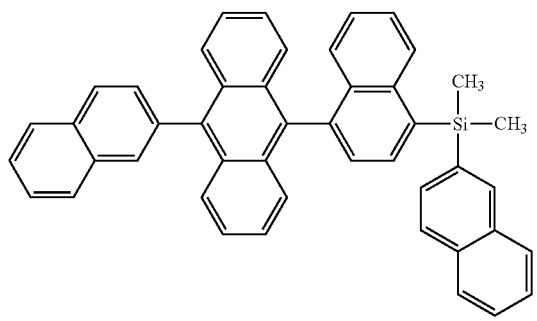
<Compound 5>
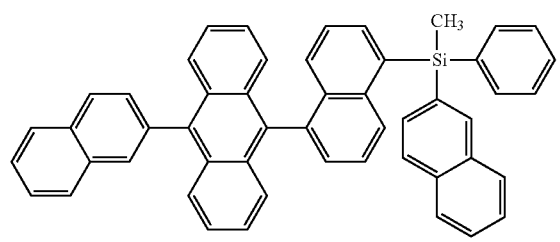
<Compound 6>
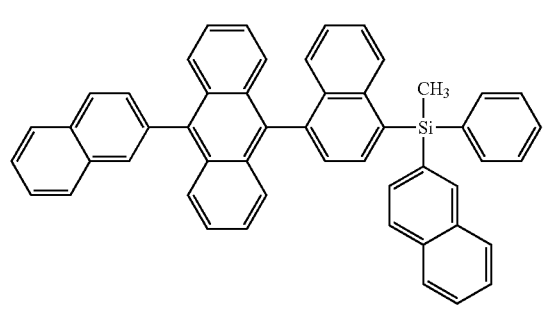
<Compound 7>
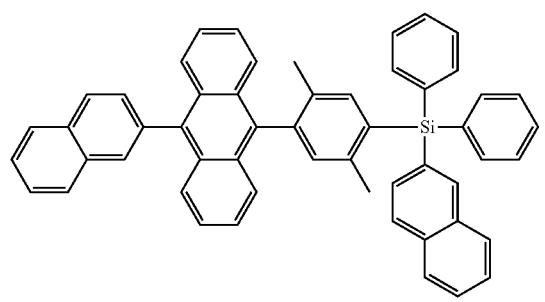
<Compound 8>
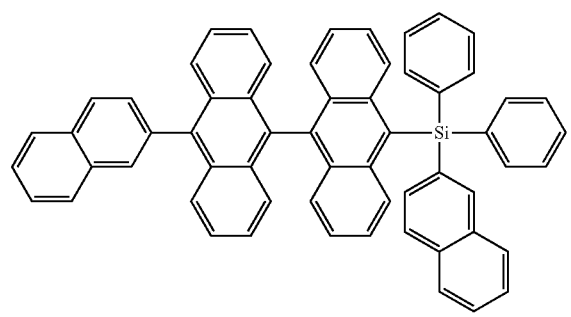

<Compound 9>
<Compound 10>
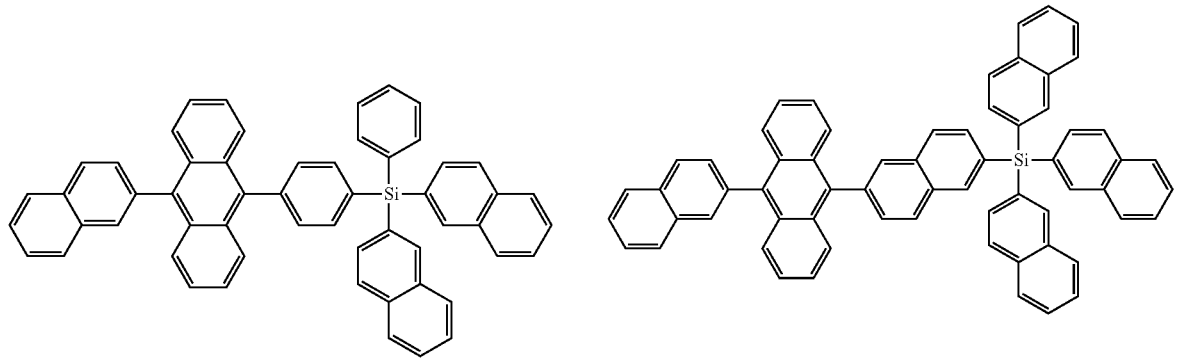
<Compound 11>
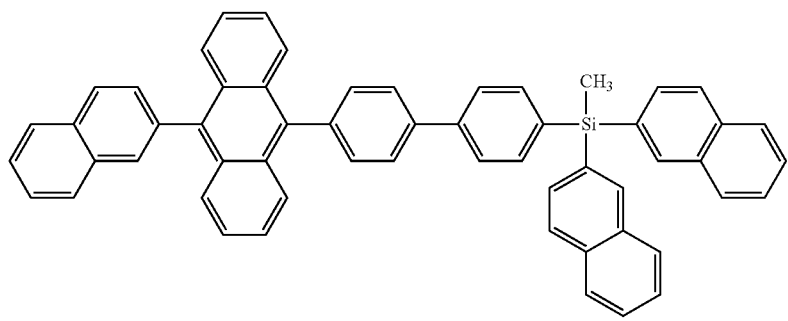
<Compound 12>
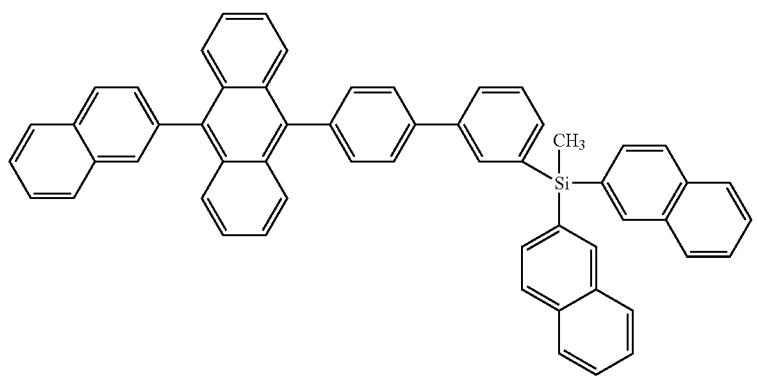
<Compound 14>
<Compound 13>
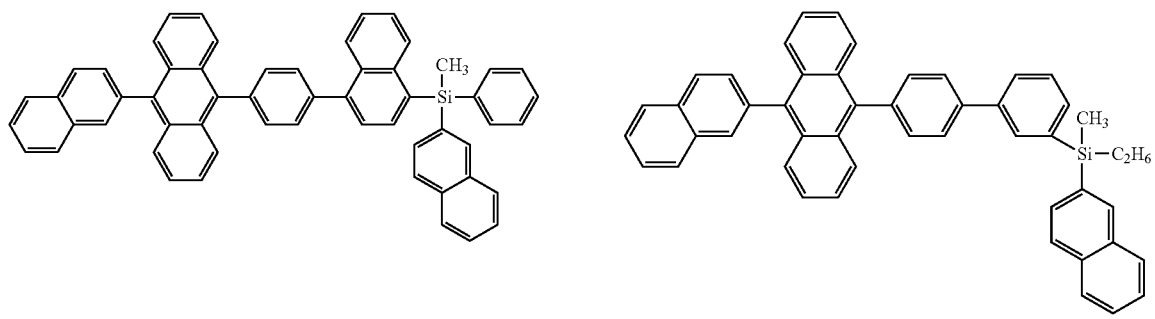

<Compound 15>
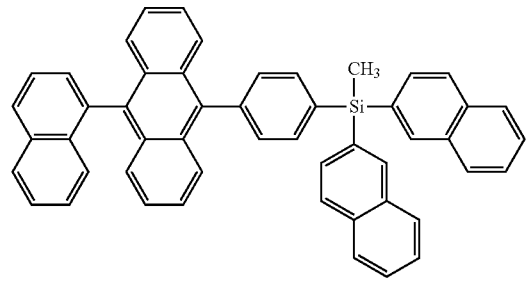
<Compound 16>
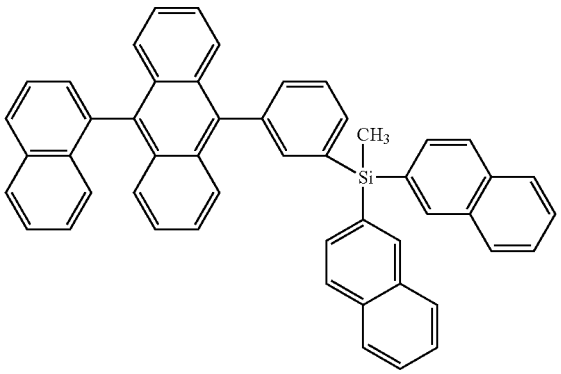
<Compound 17>
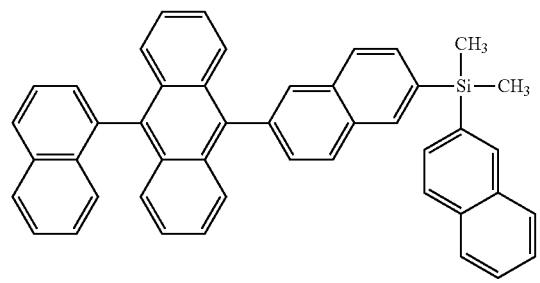
<Compound 18>
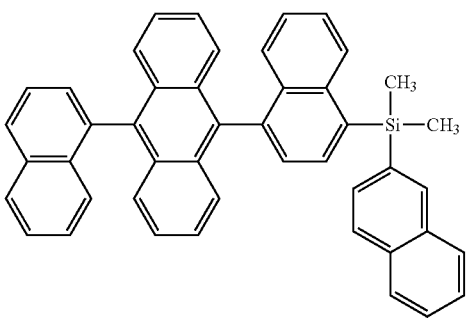
<Compound 19>
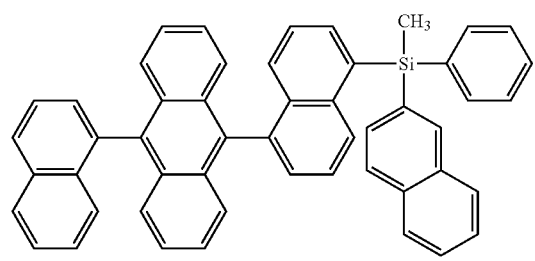
<Compound 20>
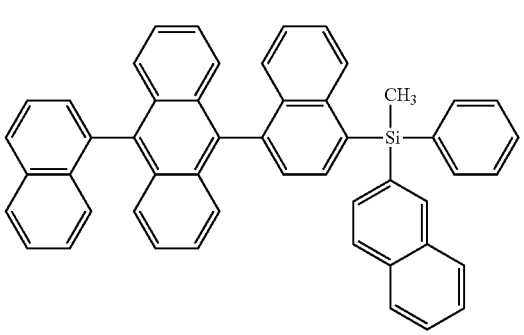

-continued
<Compound 21>
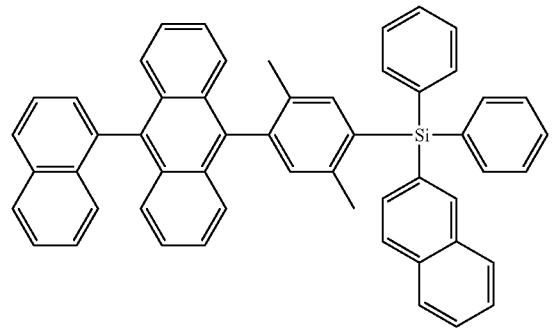
<Compound 22>
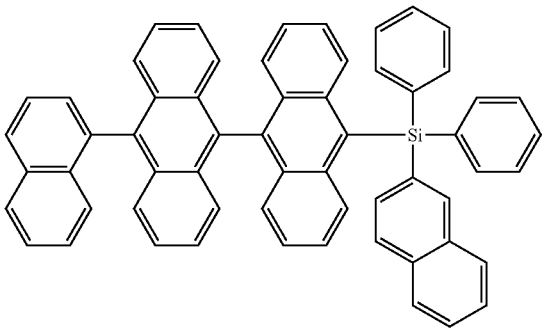
<Compound 23>
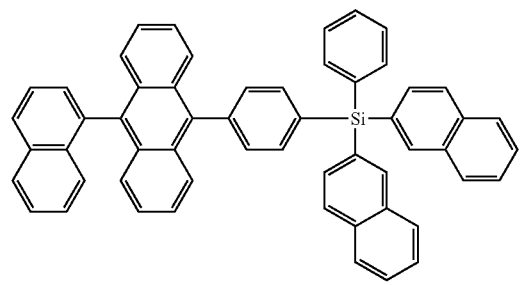
<Compound 24>
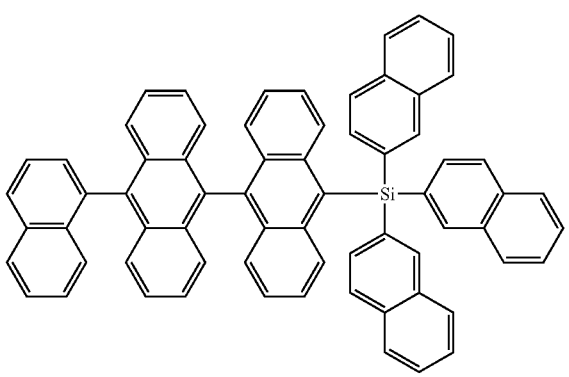
<Compound 25>
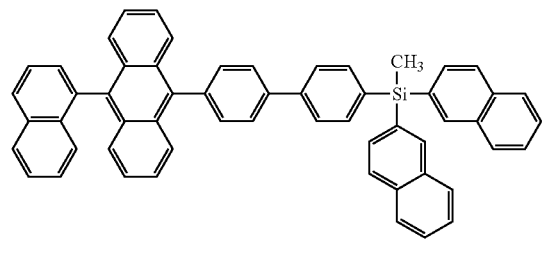
<Compound 26>
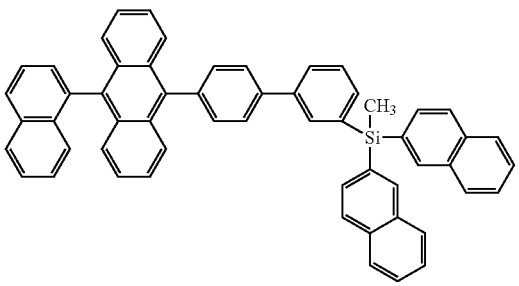

<Compound 27>  <Compound 28>

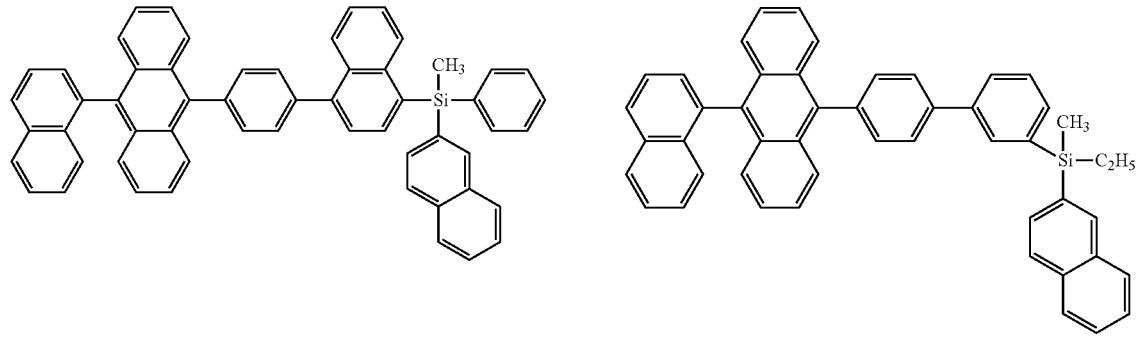

In an embodiment, the anthracene-based compound of Formula 1 may have the anthracene ring (e.g., linked with silicon) substituted asymmetrically. A maximum photoluminescence (PL) peak wavelength of the anthracene-based compound of Formula 1 may be easily controlled by using different types of substituents. The thermal stability, optical characteristics, and chemical characteristics of the anthracene-based compound of Formula 1 may also be controlled by introducing an appropriate type of substituent. An organic light-emitting device including the anthracene-based compound of Formula 1 may have a high emission efficiency and may emit blue light.

In the anthracene-based compound of Formula 1, an anthracene ring and a naphthalene ring might not form a conjugate structure due to a Si atom. Accordingly, an electron distribution of the anthracene ring may be less affected by the introduction of the naphthalene ring, and the naphthalene ring may independently serve as an emission host. When an aromatic condensed ring having 10 or more carbon atoms is introduced to a Si atom, for example, the aromatic condensed ring may serve as an emission host. As compared to a compound substituted with an aromatic ring including a relatively low number of carbons, the anthracene-based compound of Formula 1, which includes an aromatic condensed ring having a large number of carbons, such as a naphthalene ring, introduced to a Si atom, may be more suitable for use as an emission host.

The anthracene-based compound of Formula 1 includes a 2-naphthyl group bound at the 9-position of the anthracene ring, and thus may be electrically more stable than the anthracene-based compound with a 1-naphthyl group. The anthracene-based compound of Formula 1 may be synthesized using organic synthesis. A synthesis method of the anthracene-based compound of Formula 1 may be understood by one of ordinary skill in the art with reference to the examples herein.

At least one anthracene-based compound of Formula 1 may be used between a pair of electrodes in an organic light-emitting device. For example, at least one anthracene-based compound of Formula 1 may be used in an emission layer. For example, at least one anthracene-based compound of Formula 1 may be used as a host in the emission layer. An organic light-emitting device includes a first electrode, a second electrode opposite to the first electrode, and an organic layer between the first and second electrodes, wherein the organic layer includes at least one anthracene-based compound of Formula 1. As used herein, "(for example, the organic layer) including at least one anthracene-based compound may indicate that "(the organic layer) including one of the anthracene-based compounds of Formula 1, or at least two different anthracene-based compounds of Formula 1."

The organic layer may include, for example, only Compound 1 as the anthracene-based compound. Compound 1 may be present in the hole transport layer of the organic light-emitting device. The organic layer may include, for example, Compounds 1 and 2 as the anthracene-based compound. Compound 1 and Compound 2 may be in the same layer, for example, in the emission layer, or in first and second emission layers of the organic light-emitting device.

The organic layer may include a hole transport region between the first electrode and the emission layer, and an electron transport region between the emission layer and the second electrode, the hole transport region including at least one of a hole injection layer, a hole transport layer, a functional layer (hereinafter, an "H-functional layer") having both hole injection and hole transport capabilities, a buffer layer, and an electron blocking layer; the electron transport region including at least one of a hole blocking layer, an electron transport layer, and an electron injection layer. For example, the anthracene-based compound of Formula 1 may be present in the emission layer and/or located in another suitable location. For example, the emission layer may further include a dopant. For example, the anthracene-based compound of Formula 1 may serve as a host. The term "organic layer" as used herein may refer to a single layer and/or a plurality of layers between the first and second electrodes of the organic light-emitting device.

FIG. 1 illustrates a schematic sectional view of an organic light-emitting device 100. Hereinafter, a structure of an organic light-emitting device and a method of manufacturing the same are described with reference to FIG. 1. Referring to FIG. 1, the organic light-emitting device 100 according to the present embodiment includes a substrate 110, a first electrode 120, an organic layer 130, and a second electrode 140. The substrate 110 may be any substrate suitable for use in organic light-emitting devices. For example, the substrate 11 may be a glass substrate or a transparent plastic substrate with strong mechanical strength, thermal stability, transparency, surface smoothness, ease of handling, and water resistance.

The first electrode 120 may be formed by depositing or sputtering a first electrode-forming material on the substrate 110. When the first electrode 120 constitutes an anode, for example, a material having a high work function may be used as the first electrode-forming material to facilitate hole injection. The first electrode 120 may be a reflective electrode or a transmission electrode. Transparent and conductive materials such as ITO, IZO, $SnO_2$, and ZnO may be used to form the first electrode 120. The first electrode 120 may be a reflective electrode using magnesium (Mg), aluminum (Al), aluminum-lithium (Al—Li), calcium (Ca), magnesium-indium (Mg—In), magnesium-silver (Mg—Ag), or the like.

The first electrode 120 may have a single-layer structure or a multi-layer structure including at least two layers. For example, the first electrode 120 may have a three-layered structure of ITO/Ag/ITO. Other number of layers and material layers may be employed. The organic layer 130 may be on the first electrode 120. The organic layer 130 may include a hole injection layer (HIL) 131, a hole transport layer (HTL) 132, a functional layer (not shown), also referred to as an H-functional layer) having both hole injection and transport capabilities, a buffer layer, an emission layer (EML) 133, an electron transport layer (ETL) 134, and an electron injection layer (EIL) 135.

The HIL 131 may be on the first electrode 120 by any of a variety of methods, for example, including vacuum deposition, spin coating, casting, Langmuir-Blodgett (LB) deposition, or the like. When the HIL 131 is formed using vacuum deposition, for example, vacuum deposition conditions may vary depending on the compound that is used to form the HIL 131, and the desired structure and thermal properties of the HIL 131 to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. Other deposition conditions may be employed.

When the HIL 131 is formed using spin coating, for example, the coating conditions may vary depending on the compound that is used to form the HIL 131, and the desired structure and thermal properties of the HIL 131 to be formed. For example, the coating rate may be in the range of about 2000 rpm to about 5000 rpm, and a temperature at which heat treatment is performed to remove a solvent after coating may be in the range of about 80° C. to about 200° C. Other coating conditions may be employed.

A material for forming the HIL 131 may be a suitable hole injection material. Examples of the suitable hole injection material include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), 4,4',4''-tris(N,N-diphenylamino)triphenylamine (TDATA), 4,4',4''-tris[2-naphthyl(phenyl)amino]triph- enylamine (2-TNATA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), and polyaniline)/poly(4-styrene-sulfonate) (PANI/PSS).

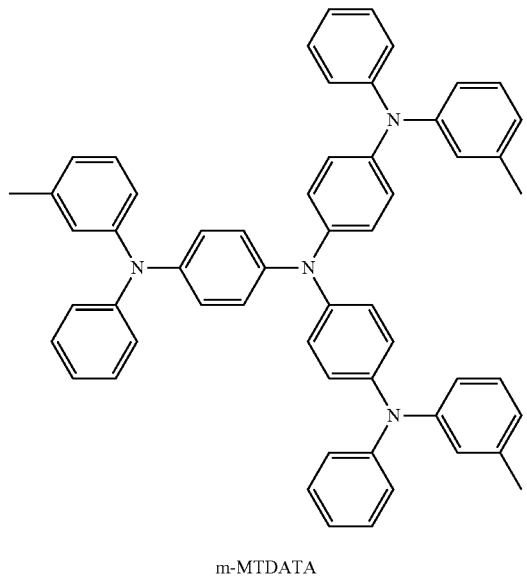

m-MTDATA

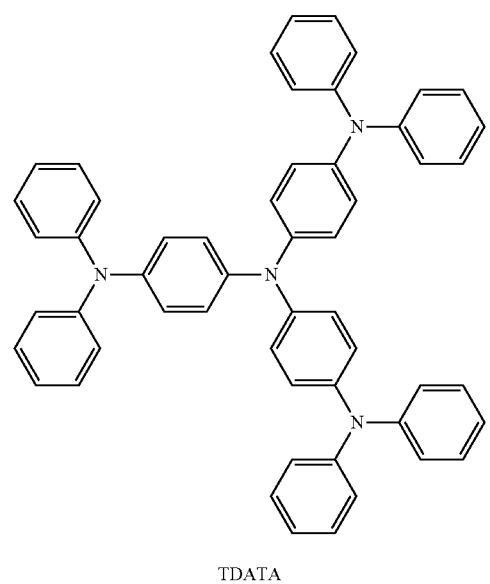

TDATA

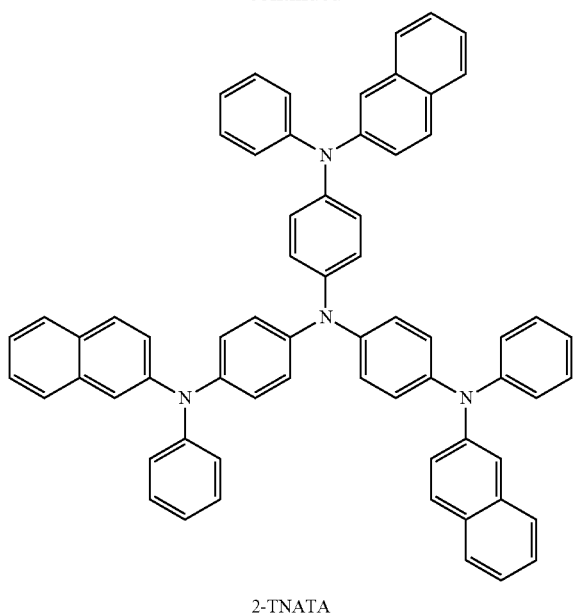

2-TNATA

The thickness of the HIL 131 may be, for example, about 100 Å to about 10000 Å, or, for example, from about 100 Å to about 1000 Å. When the thickness of the HIL 131 is within these ranges, for example, the HIL 131 may have a good hole injecting ability without a substantial increase in driving voltage.

The HTL 132 may be formed on the HIL 131 by using any of a variety of methods, for example, vacuum deposition, spin coating, casting, LB deposition, or the like. When the HTL 132 is formed using vacuum deposition or spin coating, for example, the conditions for deposition and coating may be similar to those for the formation of the HIL 131, though the conditions for the deposition and coating may vary depending on the material that is used to form the HTL 132.

Examples of suitable hole transport materials include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine) (NPB).

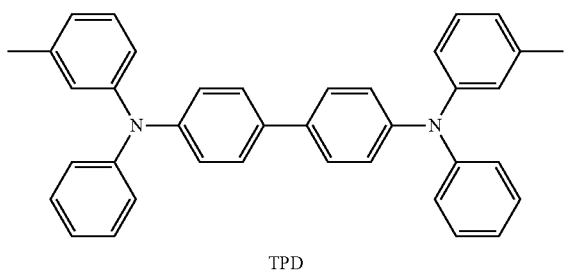

TPD

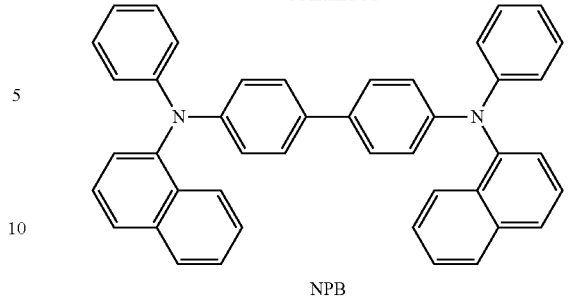

NPB

The thickness of the HTL 132 may be, for example, from about 50 Å to about 2000 Å, or, for example, may be from about 100 Å to about 1500 Å. When the thickness of the HTL 132 is within these ranges, for example, the HTL 132 may have a good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be, for example, from about 500 Å to about 10,000 Å, or, for example, may be from about 100 Å to about 1,000 Å. When the thickness of the H-functional layer is within these ranges, for example, the H-functional layer may have good hole injection and transport capabilities without a substantial increase in driving voltage.

At least one of the HIL 131, the HTL 132, and the H-functional layer may include at least one of a compound of Formula 300 and a compound of Formula 350:

<Formula 300>

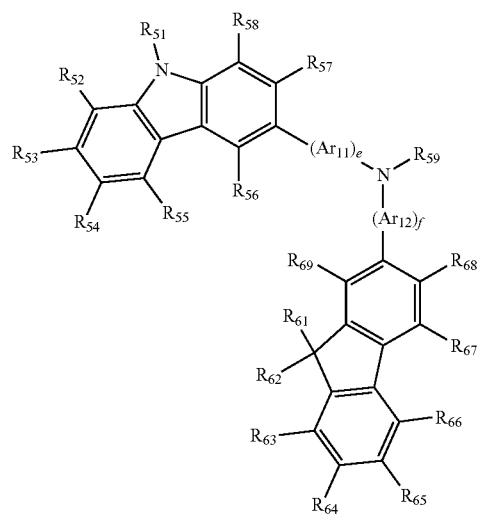

<Formula 350>

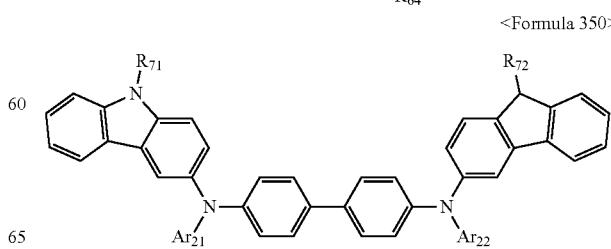

In Formula 300, $Ar_{11}$ and $Ar_{12}$ may be each independently selected from, for example, a substituted or unsubstituted $C_3$-$C_{30}$ cycloalkylene group, a substituted or unsubstituted $C_3$-$C_{30}$ cycloalkenylene group, a substituted or unsubstituted $C_6$-$C_{30}$ arylene group, a substituted or unsubstituted $C_1$-$C_{30}$ heterocycloalkylene group, a substituted or unsubstituted $C_1$-$C_{30}$ heterocycloalkenylene group, and a substituted or unsubstituted $C_1$-$C_{30}$ heteroarylene group. A detailed description of $Ar_{11}$ and $Ar_{12}$ may be the same as described in conjunction with $Ar_1$.

In Formula 350, $Ar_{21}$ and $Ar_{22}$ may be each independently a substituted or unsubstituted arylene group. For example, a detailed description of $Ar_{21}$ and $Ar_{22}$ may be the same as described in conjunction with $R_1$. For example, $Ar_{21}$ and $Ar_{22}$ in Formula 350 may be each independently selected from a phenylene group, a naphthylene group, an anthrylene group, and a biphenylene group; and a phenylene group, a naphthylene group, an anthrylene group, and a biphenylene group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, and a substituted or unsubstituted $C_1$-$C_{30}$ alkoxy group. Other groups may be employed.

In Formula 300, e and f may be each independently an integer from 0 to 5, for example, may be 0, 1, or 2. For example, e may be 1, and f may be 0. Other integers for e and f may also be employed.

In Formulae 300 and 350, $R_{51}$ to $R_{58}$, $R_{61}$ to $R_{69}$, $R_{71}$, and $R_{72}$ may be each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group. For example, $R_{51}$ to $R_{58}$, $R_{61}$ to $R_{69}$, $R_{71}$, and $R_{72}$ in Formulae 300 and 350 may be each independently selected, for example, from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group (for example, a methyl group, an ethyl group, a propyl group, a butyl group, a pentyl group, a hexyl group, and the like), and a $C_1$-$C_{30}$ alkoxy group (for example, a methoxy group, an ethoxy group, a propoxy group, a butoxy group, a pentoxy group, and the like); a $C_1$-$C_{30}$ alkyl group and a $C_1$-$C_{30}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, and a pyrenyl group; and a phenyl group, a naphthyl group, an anthryl group, a fluorenyl group, and a pyrenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, and a $C_1$-$C_{30}$ alkoxy group.

In Formula 300, $R_{59}$ may be selected from a phenyl group, a naphthyl group, an anthryl group, a biphenyl group, and a pyridyl group; and a phenyl group, a naphthyl group, an anthryl group, a biphenyl group, and a pyridyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, and a substituted or unsubstituted $C_1$-$C_{30}$ alkoxy group.

The compound of Formula 300 may be a compound, for example, represented by Formula 300A:

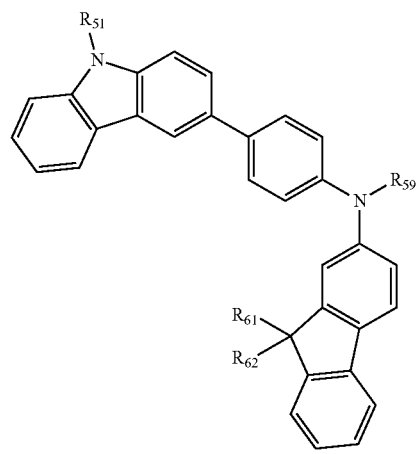

<Formula 300A>

In Formula 300A, a detailed description of $R_{51}$, $R_{61}$, $R_{62}$, and $R_{59}$ may be the same as the ones for Formula 300 described. At least one of the HIL 131, the HTL 132, and the H-functional layer may include, for example, at least one of the compounds represented by Formulae 301 to 320:

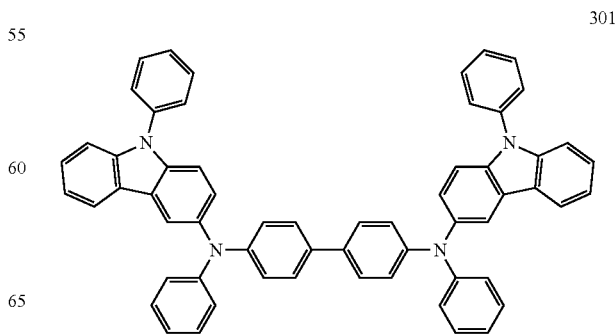

301

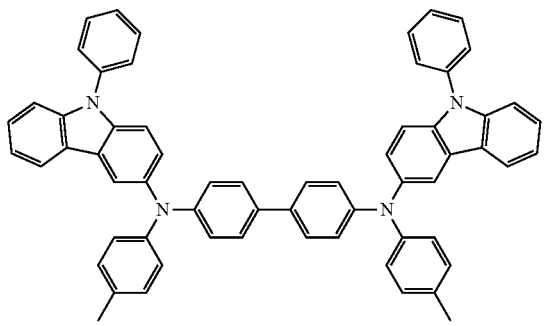
302
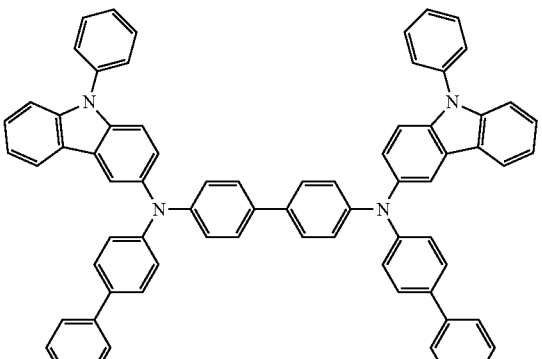
306
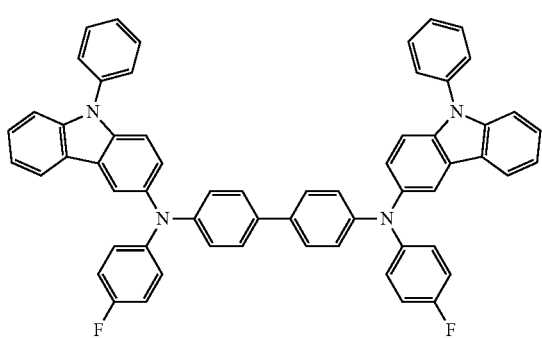
303
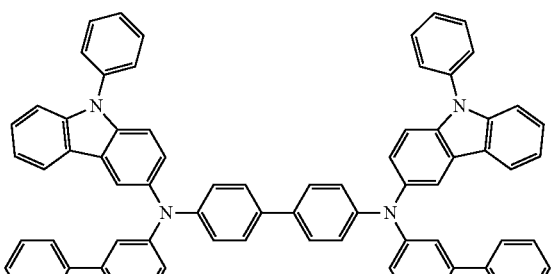
307
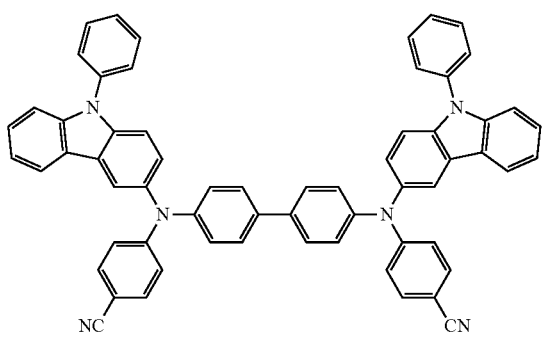
304
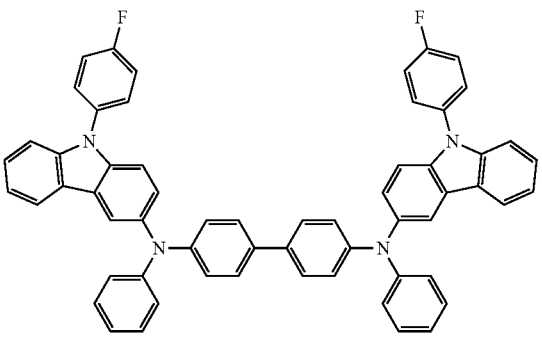
308
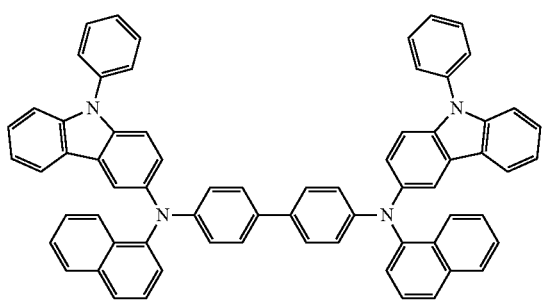
305
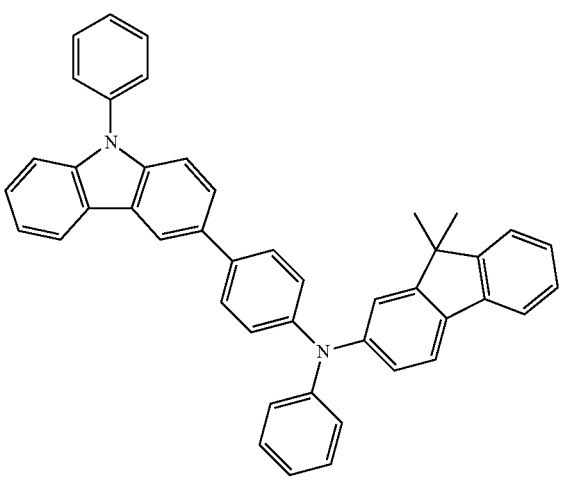
309

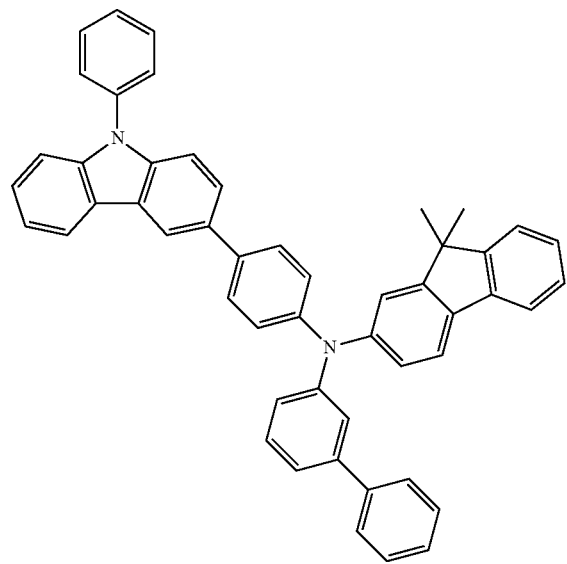
310
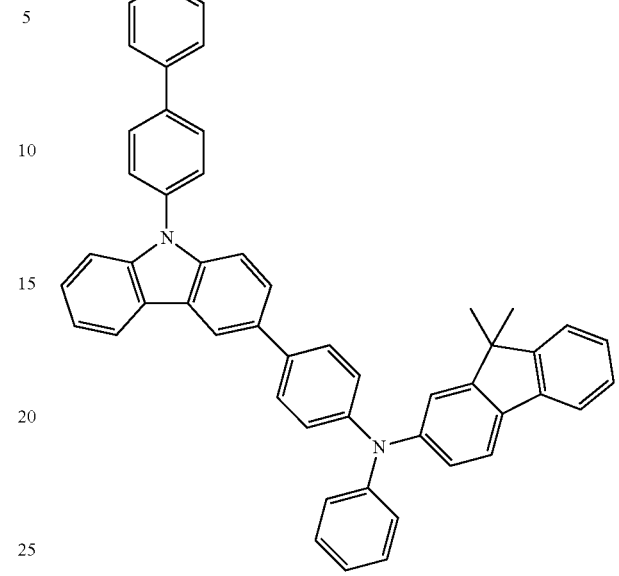
312
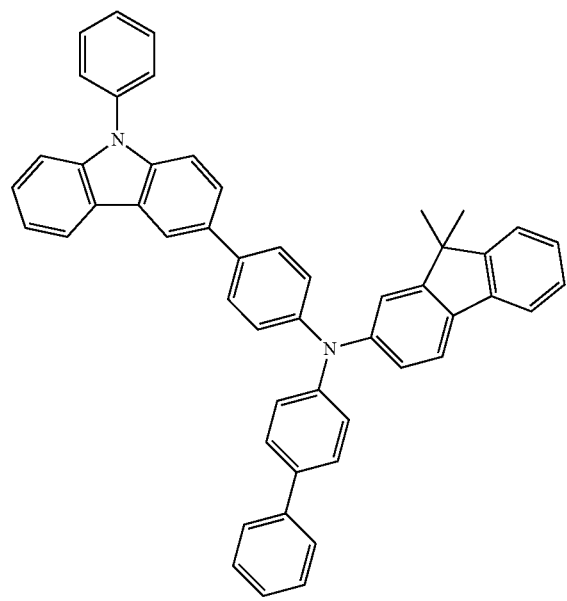
311
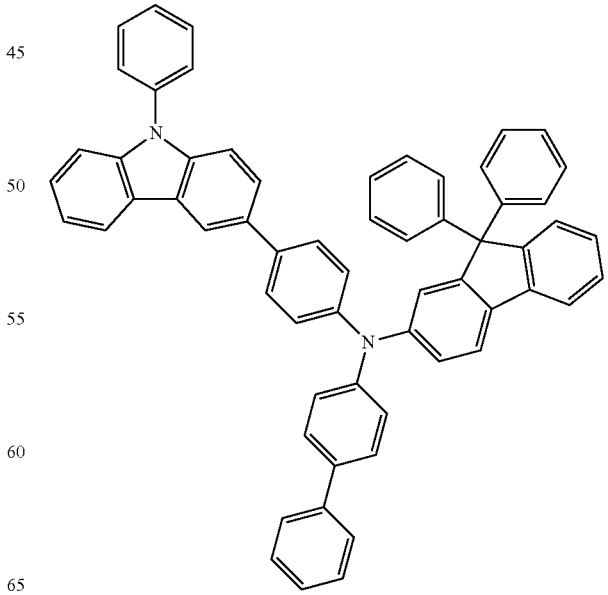
313

314
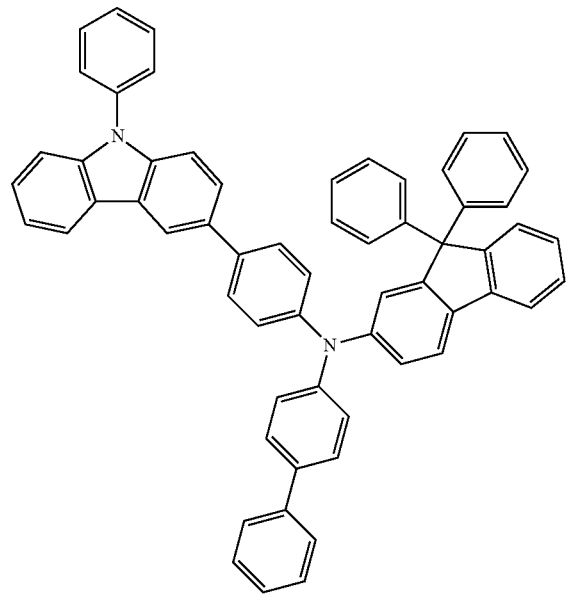
315
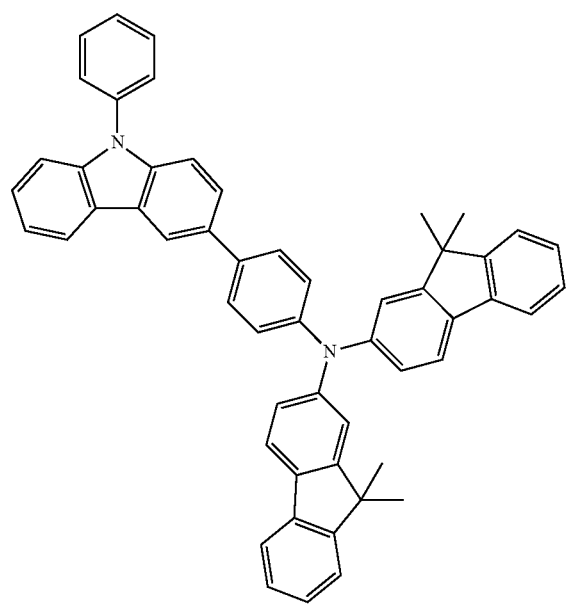
316
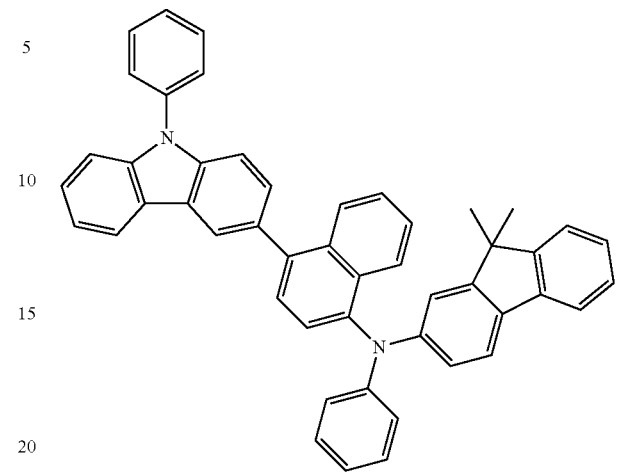
317
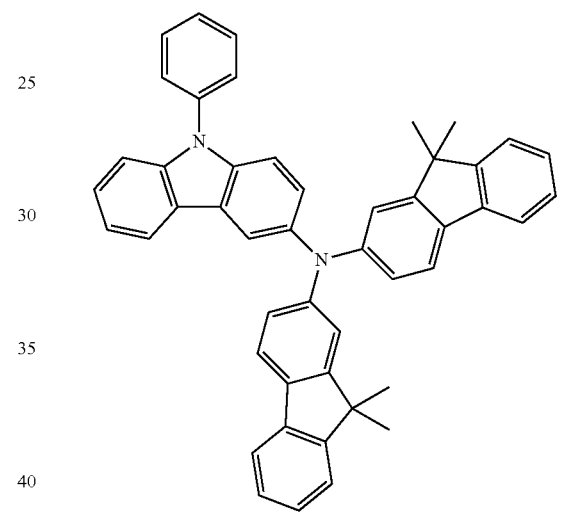
318
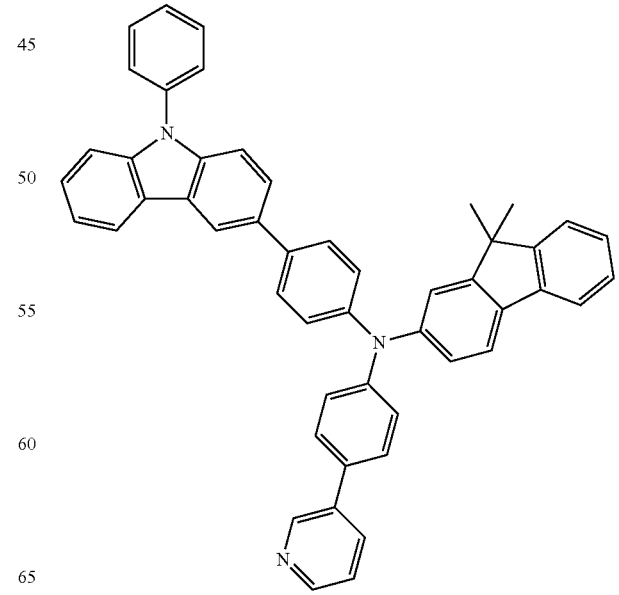

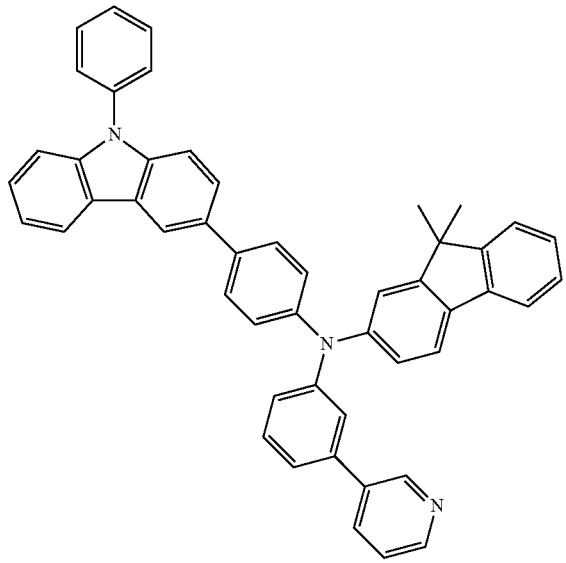

319

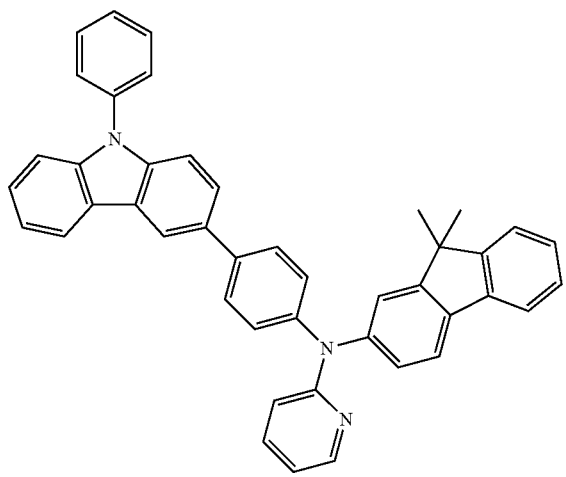

320

At least one of the HIL 131, the HTL 132, and the H-functional layer may further include a charge-generating material to have improved conductivity, in addition to a suitable hole injecting material, hole transport material, and/or material having both hole injection and hole transport capabilities. The charge-generating material may be, for example, one of quinine derivatives, metal oxides, and compounds with a cyano group. Examples of the p-dopant include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200.

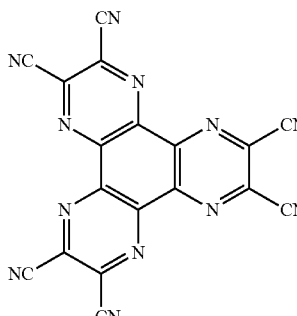

<Compound 200>

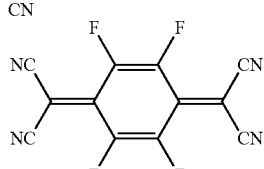

<F4-TCNQ>

When the HIL 131, the HTL 132, or the H-functional layer further includes a charge-generating material, for example, the charge-generating material may be homogeneously dispersed or inhomogeneously distributed in the layer. The buffer layer may be between at least one of the HIL 131, the HTL 132, and the H-functional layer, and the EML 133. The buffer layer may compensate for an optical resonance distance of light according to a wavelength of the light emitted from the EML 133, and thus may increase efficiency. The buffer layer may include any hole injecting material or hole transporting material that is suitable. The buffer layer may include the same material as one of the materials included in the HIL 131, the HTL 132, and the H-functional layer that underlie the buffer layer.

The EML 133 may be formed on the HTL 132, the H-functional layer, or the buffer layer by vacuum deposition, spin coating, casting, LB deposition, or the like. When the EML 133 is formed using vacuum deposition or spin coating, the deposition and coating conditions may be similar to those for the formation of the HIL 131, though the conditions for deposition and coating may vary depending on the material that is used to form the EML 133. The EML 133 may include a suitable light-emitting material. For example, the EML 133 may include the anthracene-based compound of Formula 1. The EML 133 may include a suitable host and a suitable dopant. Examples of a suitable host include aluminum this (8-hydroxyquinoline) ($Alq_3$), 4,4'-N,N'-dicarbazole-biphenyl (CBP), poly(n-binylcarbazole (PVK), 9,10-di(naphthalene-2-yl)anthracene (ADN), 4,4',4"-tris(carbazole-9-yl)triphenylamine (TCTA), 1,3,5-tris(N-phenylbenzimidazole-2-yl)benzene) (TPBI), 3-tert-butyl-9,10-di(naphth-2-yl)anthracene (TBADN), 9,9'-(1,3-phenylene)bis-9H-carbazole (mCP), and 1,3-bis[2-(4-tert-butylphenyl)-1,3,4-oxadiazo-5-yl] (OXD-7).

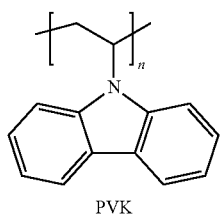

PVK

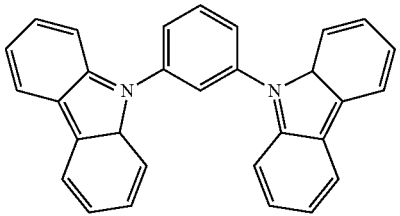

mCP

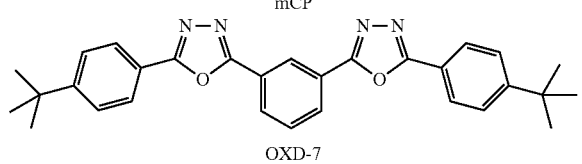

OXD-7

For example, at least one of a fluorescent dopant and a phosphorescent dopant may be used. For example, the phosphorescent dopant may be an organometallic complex including at least one selected from among iridium (Ir), platinum (Pt), osmium (Os), rhenium (Re), titanium (Ti), zirconium (Zr), hafnium (Hf), and a combination of at least two thereof.

Examples of suitable blue dopants include $F_2$Irpic, $(F_2ppy)_2$Ir(tmd), Ir(dfppz)$_3$, ter-fluorene, 4,4'-bis(4-diphenylaminostyryl)biphenyl (DPAVBi), 2,5,8,11-tetra-tert-butyl pherylene (TBPe), and 4,4'-bis(2,2-diphenylvinyl)-1,1'-biphenyl (DPVBi).

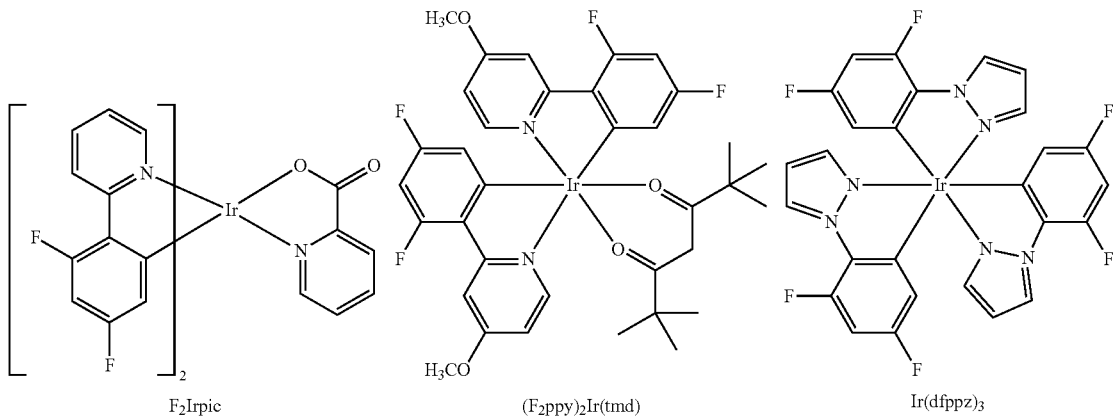

F$_2$Irpic    (F$_2$ppy)$_2$Ir(tmd)    Ir(dfppz)$_3$

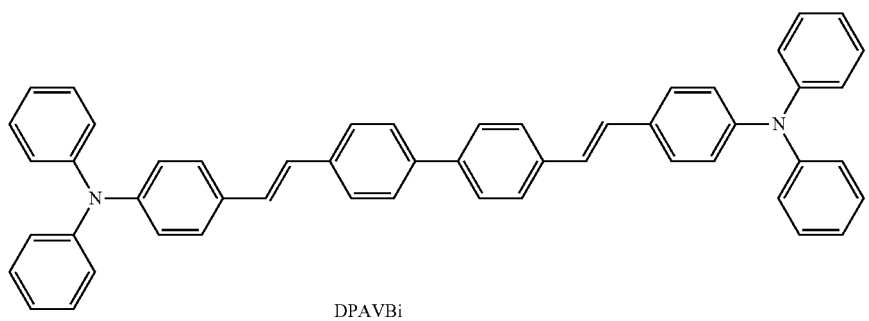

DPAVBi

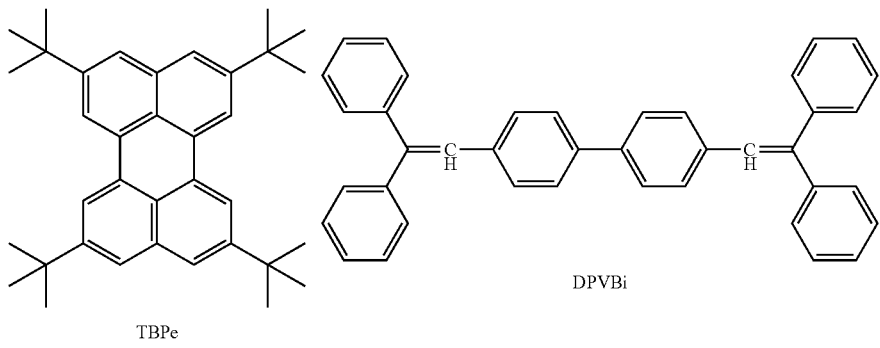

TBPe    DPVBi

Examples of suitable red dopants include PtOEP, Ir(piq)$_3$, and BtpIr.

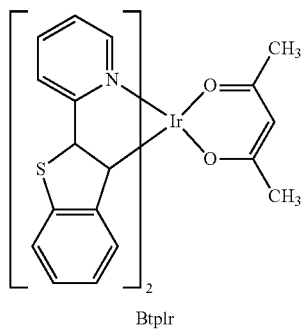

BtpIr

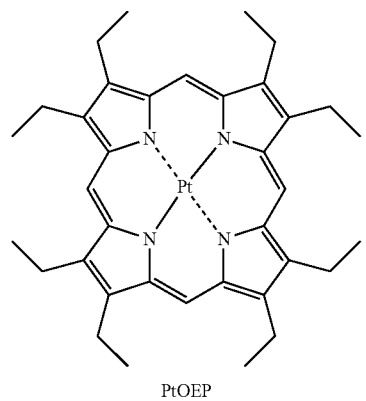

PtOEP

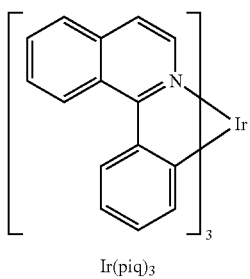

Ir(piq)$_3$

Examples of green dopants include Ir(ppy)$_3$ (ppy=phenylpyridine), Ir(ppy)$_2$(acac), and Ir(mpyp)$_3$.

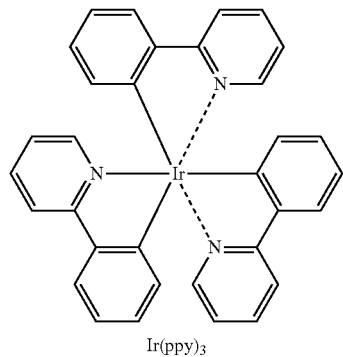

Ir(ppy)$_3$

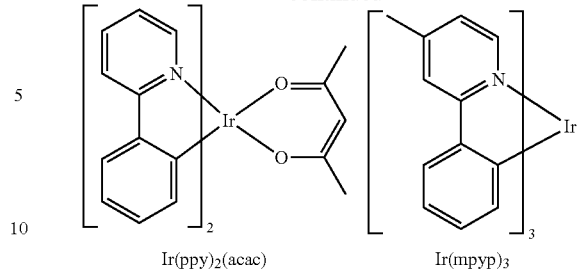

Ir(ppy)$_2$(acac)   Ir(mpyp)$_3$

For example, the dopant may be a dopant represented by Formula 100:

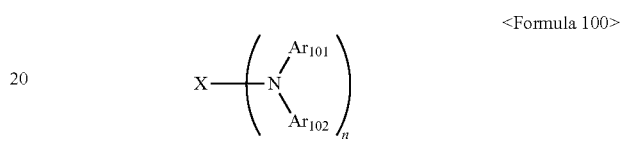

<Formula 100>

In Formula 100, X may be selected from a substituted or unsubstituted $C_3$-$C_{30}$ cycloalkyl group, a substituted or unsubstituted $C_3$-$C_{30}$cycloalkenyl group, and a substituted or unsubstituted $C_6$-$C_{30}$ aryl group; $Ar_{101}$ and $Ar_{102}$ may be each independently selected from a substituted or unsubstituted $C_6$-$C_{30}$ aryl group and a substituted or unsubstituted $C_1$-$C_{30}$ heteroaryl group; and n may be an integer from 1 to 4. X in Formula 100 may be selected, for example, from i) a naphthalenyl group, a phenanthrenyl group, a pyrenyl group, an anthracenyl group, a chrysenyl group, a fluorenyl group, and a benzofluorenyl group; and ii) a naphthalenyl group, a phenanthrenyl group, a pyrenyl group, an anthracenyl group, a chrysenyl group, a fluorenyl group, and a benzofluorenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, and a $C_1$-$C_{30}$ heteroaryl group.

X in Formula 100 may be selected, for example, from i) a fluorenyl group and a benzofluorenyl group; and ii) a fluorenyl group and a benzofluorenyl group, each substituted with at least one of a deuterium atom, —F, a cyano group, a nitro group, a methyl group, an ethyl group, a n-propyl group, an iso-propyl group, a n-butyl group, a sec-butyl group, an iso-butyl group, a tert-butyl group, and a phenyl group.

X in Formula 100 may be selected, for example, from i) a fluorenyl group and a benzofluorenyl group; and ii) a fluorenyl group and a benzofluorenyl group, each substituted with a phenyl group. For example, in Formula 100, $Ar_{101}$ and $Ar_{102}$ may be each independently selected from i) a $C_6$-$C_{30}$ aryl group; and ii) a $C_6$-$C_{30}$ aryl group substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, a $C_1$-$C_{30}$ heteroaryl group, and —Si($Q_1$)($Q_2$)($Q_3$), where $Q_1$ to $Q_3$ may be each independently selected from a $C_1$-$C_{30}$ alkyl group and a $C_6$-$C_{30}$ aryl group.

Ar101 and Ar102 in Formula 100 may be each independently selected, for example, from i) a phenyl group, a naphthyl group, and a biphenyl group; and ii) a phenyl group, a naphthyl group, and a biphenyl group, each substituted with at least one selected from a deuterium atom, —F, a cyano group, a nitro group, a methyl group, an ethyl group, a n-propyl group, an iso-propyl group, a n-butyl group, a sec-butyl group, an iso-butyl group, a tert-butyl group, a phenyl group, and —Si(Q1)(Q2)(Q3), where Q1 to Q3 may be each independently selected from a methyl group, a tert-butyl group, and a phenyl group.

Ar101 and Ar102 in Formula 100 may be each independently selected, for example, from i) a phenyl group; and ii) a phenyl group substituted with at least one selected from —F, a methyl group, a phenyl group, and —Si(CH$_3$)$_3$. For example, in Formula 100, n may be an integer of 2. Other integers may be employed for n. The dopant represented by Formula 100 may be, for example, Compound 101:

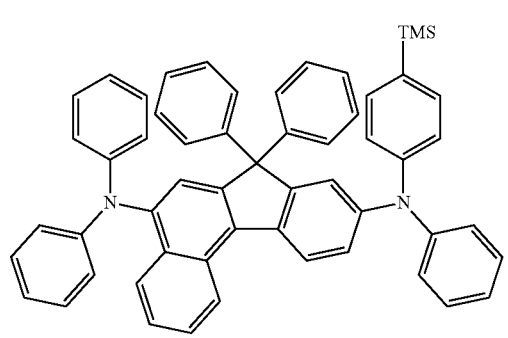

101

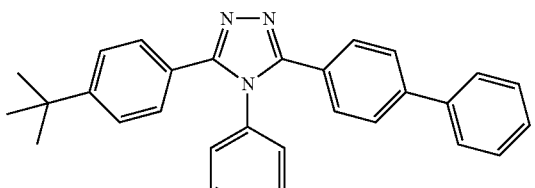

TAZ

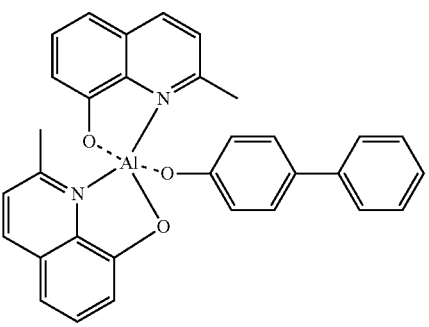

BAlq

When the EML 133 includes both a host and a dopant, for example, an amount of the dopant may be from about 0.01 wt % to about 15 wt % based on 100 wt % of the EML 133. Other amounts of the dopant may be employed. A thickness of the EML 133 may be, for example, about 200 Å to about 700 Å. When the thickness of the EML 133 is within these ranges, for example, the EML 133 may have a good light emitting ability without a substantial increase in driving voltage.

The ETL 134 may be formed on the EML 133 by vacuum deposition, spin coating, casting, or the like. When the ETL 134 is formed using vacuum deposition or spin coating, for example, the deposition and coating conditions may be similar to those for the formation of the HIL 131, though the deposition and coating conditions may vary depending on a compound that is used to form the ETL 134. A material for forming the ETL 134 may be any suitable material that can stably transport electrons injected from an electron injecting electrode (cathode). Examples of materials for forming the ETL 134 include a quinoline derivative, such as tris(8-quinolinorate)aluminum (Alq3), TAZ, BAlq, beryllium bis (benzoquinolin-10-olate) (Bebq2), 9,10-di(naphthalene-2-yl) anthracene (ADN), Compound 201, Compound 202, and Bphen.

<Compound 201>

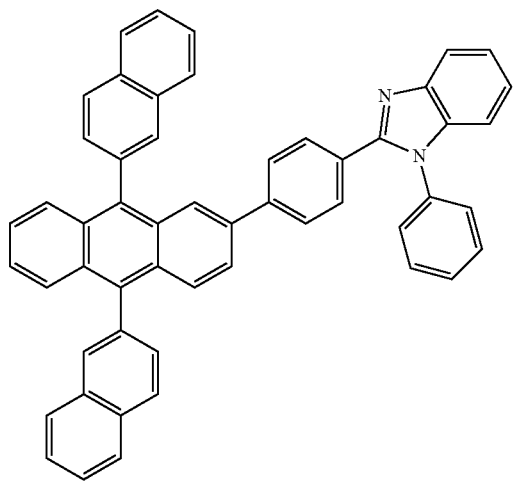

<Compound 202>

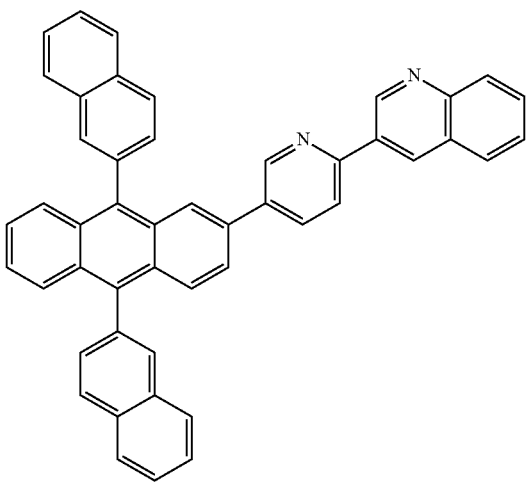

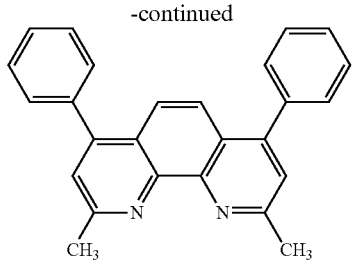

BCP

Bphen

The thickness of the ETL 135 may be, for example, from about 100 Å to about 1,000 Å, or, for example, may be from about 150 Å to about 500 Å. When the thickness of the ETL 135 is within these ranges, for example, the ETL 135 may have a satisfactory electron transporting ability without a substantial increase in driving voltage. The ETL 135 may further include a metal-containing material, in addition to any suitable electron-transporting organic compound. The metal-containing material may include a lithium (Li) complex. Examples of the Li complex include lithium quinolate (Liq) and Compound 203:

<Compound 203>

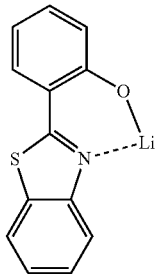

Then, the EIL 135, which facilitates injection of electrons from the cathode, may be formed on the ETL 134. Any suitable electron-injecting material may be used to form the EIL 135. Examples of materials for forming the EIL 135 include LiF, NaCl, CsF, $Li_2O$, and BaO. The deposition and coating conditions for forming the EIL 135 may be similar to those for the formation of the HIL 131, though the deposition and coating conditions may vary depending on the material that is used to form the EIL 135.

The thickness of the EIL 135 may be, for example, from about 1 Å to about 100 Å, or, for example, may be from about 3 Å to about 90 Å. When the thickness of the EIL 135 is within these ranges, for example, the EIL 135 may have a satisfactory electron injection ability without a substantial increase in driving voltage.

The second electrode 140 may be on the organic layer 130. The second electrode 140 may be a cathode that is an electron injection electrode. A material for forming the second electrode 140 may be a metal, an alloy, and an electro-conductive compound, which have a low work function, or a mixture thereof. The second electrode 140 may include lithium (Li), magnesium (Mg), aluminum (Al), aluminum (Al)-lithium (Li), calcium (Ca), magnesium (Mg)-indium (In), magnesium (Mg)-silver (Ag), or the like, and may a thin film type transmission electrode. To manufacture a top-emission light-emitting device, for example, the transmission electrode may include indium tin oxide (ITO) or indium zinc oxide (IZO).

When a phosphorescent dopant is used in the EML 133, for example, a HBL may be formed between the HTL 132 and the EML 133 or between the H-functional layer and the EML 133 by using vacuum deposition, spin coating, casting, LB deposition, or the like, in order to prevent diffusion of triplet excitons or holes into the ETL 135. When the HBL is formed using vacuum deposition or spin coating, for example, the conditions for deposition and coating may be similar to those for the formation of the HIL 131, although the conditions for deposition and coating may vary depending on the material that is used to form the HBL. Any suitable hole-blocking material may be used. Examples of hole-blocking materials include oxadiazole derivatives, triazole derivatives, and phenanthroline derivatives. For example, bathocuproine (BCP) represented by the following formula may be used as a material for forming the HBL.

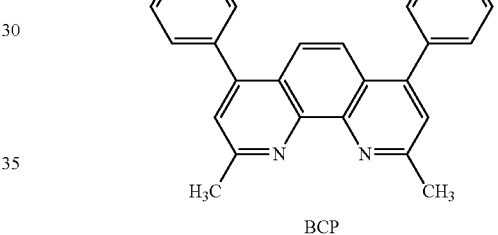

BCP

The thickness of the HBL may be, for example, from about 20 Å to about 1000 Å, or, for example, may be from about 30 Å to about 300 Å. When the thickness of the HBL is within these ranges, for example, the HBL may have improved hole blocking ability without a substantial increase in driving voltage. Other organic light-emitting devices besides that illustrated in FIG. 1 and described herein, or variations thereof, may be employed.

As used herein, the unsubstituted $C_1$-$C_{30}$ alkyl group (or a $C_1$-$C_{30}$ alkyl group) may be a linear or branched $C_1$-$C_{30}$ alkyl group, such as a methyl group, an ethyl group, a propyl group, an isobutyl group, a sec-butyl group, a pentyl group, an iso-amyl groups, and a hexyl group. The substituted $C_1$-$C_{60}$ alkyl group may be a $C_1$-$C_{60}$ alkyl group of which at least one hydrogen atom is substituted with one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, and a $C_1$-$C_{30}$ alkoxy group;

a $C_1$-$C_{30}$ alkyl group, a $C_2$-$C_{60}$ alkenyl group, a $C_2$-$C_{30}$ alkynyl group, and a $C_1$-$C_{30}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, and a $C_2$-$C_{30}$ heteroaryl group;

a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, and a $C_2$-$C_{30}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a phenyl group, a naphthyl group, an anthryl group, a fluorenyl group, a dimethyl fluorenyl group, a diphenyl fluorenyl group, a carbazolyl group, a phenylcarbazolyl group, a pyridyl group, a pyrimidyl group, a pyrazinyl group, a pyridazinyl group, a triazinyl group, a quinolyl group, and an isoquinolyl group; and —N($Q_{11}$)($Q_{12}$) and —Si($Q_{13}$)($Q_{14}$)($Q_{15}$), where $Q_{11}$ and $Q_{12}$ may be each independently a $C_6$-$C_{30}$ aryl group or a $C_1$-$C_{30}$ heteroaryl group, and $Q_{13}$ to $Q_{15}$ may be each independently a $C_1$-$C_{30}$ alkyl group, a $C_1$-$C_{30}$ alkoxy group, a $C_6$-$C_{30}$ aryl group, or a $C_1$-$C_{30}$ heteroaryl group.

As used herein, the unsubstituted $C_1$-$C_{30}$ alkoxy group (or a $C_1$-$C_{30}$ alkoxy group) may be a group represented by —OA, wherein A is an unsubstituted $C_1$-$C_{30}$ alkyl group described above. Examples of the unsubstituted $C_1$-$C_{30}$ alkoxy group are a methoxy group, an ethoxy group, and an isopropyloxy group. At least one of the hydrogen atoms in the alkoxy group may be substituted with the substituents described above in conjunction with the substituted $C_1$-$C_{30}$ alkyl group.

As used herein, the unsubstituted $C_2$-$C_{30}$ alkenyl group (or a $C_2$-$C_{30}$ alkenyl group) is a $C_2$-$C_{30}$ alkyl group having at least one carbon-carbon triple bond in the center or at a terminal thereof. Examples of the alkenyl group are an ethenyl group, a propenyl group, a butenyl group, and the like. At least one hydrogen atom in the unsubstituted $C_2$-$C_{30}$ alkenyl group may be substituted with those substituents described above in conjunction with the substituted $C_1$-$C_{30}$ alkyl group.

As used herein, the unsubstituted $C_2$-$C_{30}$ alkynyl group (or a $C_2$-$C_{30}$ alkynyl group) is a $C_2$-$C_{30}$ alkyl group having at least one carbon-carbon triple bond in the center or at a terminal thereof. Examples of the unsubstituted $C_2$-$C_{60}$ alkynyl group (or a $C_2$-$C_{60}$ alkynyl group) are an ethenyl group, a propynyl group, and the like. At least one hydrogen atom in the alkynyl group may be substituted with those substituents described above in conjunction with the substituted $C_1$-$C_{30}$ alkyl group.

As used herein, the unsubstituted $C_3$-$C_{30}$ cycloalkyl group (or a $C_3$-$C_{30}$ cycloalkyl group) indicates a cyclic, monovalent C3-C30 saturated hydrocarbon group. Non-limiting examples of the unsubstituted $C_3$-$C_{30}$ cycloalkyl group are a cyclopropyl group, a cyclobutyl group, a cyclopentyl group, a cyclohexyl group, and a cyclooctyl group. At least one hydrogen atom in the cycloalkyl group may be substituted with those substituents described above in conjunction with the substituted $C_1$-$C_{30}$ alkyl group.

As used herein, the unsubstituted $C_3$-$C_{30}$ cycloalkenyl group indicates a nonaromatic, cyclic unsaturated hydrocarbon group with at least one carbon-carbon double bond. Examples of the unsubstituted $C_3$-$C_{30}$ cycloalkenyl group are a cyclopropenyl group, a cyclobutenyl group, a cyclopentenyl group, a cyclohexcenyl group, a cycloheptenyl group, a 1,3-cyclohexadienyl group, a 1,4-cyclohexadienyl group, a 2,4-cycloheptadienyl group, and a 1,5-cyclooctadienyl group. At least one hydrogen atom in the cycloalkenyl group may be substituted with those substituents described above in conjunction with the substituted $C_1$-$C_{30}$ alkyl group.

As used herein, the unsubstituted $C_{30}$-$C_{30}$ aryl group is a monovalent group having a carbocyclic aromatic system having 6 to 30 carbon atoms including at least one aromatic ring. The unsubstituted $C_{30}$-$C_{60}$ arylene group is a divalent group having a carbocyclic aromatic system having 6 to 30 carbon atoms including at least one aromatic ring. When the aryl group and the arylene group have at least two rings, they may be fused to each other via a single bond. At least one hydrogen atom in the aryl group and the arylene group may be substituted with those substituents described above in conjunction with the $C_1$-$C_{30}$ alkyl group.

Examples of the substituted or unsubstituted $C_6$-$C_{30}$ aryl group are a phenyl group, a $C_1$-$C_{30}$ alkylphenyl group (e.g., an ethylphenyl group), a $C_1$-$C_{30}$ alkylbiphenyl group (e.g., an ethylbiphenyl group), a halophenyl group (e.g., an o-, m-, or p-fluorophenyl group and a dichlorophenyl group), a dicyanophenyl group, a trifluoromethoxyphenyl group, an o-, m-, or p-tolyl group, an o-, m-, or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, and a spiro-fluorenyl group. Examples of the substituted $C_6$-$C_{30}$ aryl group may be inferred based on those of the unsubstituted $C_6$-$C_{30}$ aryl group and the substituted $C_1$-$C_{30}$ alkyl group described above. Examples of the substituted or unsubstituted $C_6$-$C_{30}$ arylene group may be inferred based on those examples of the substituted or unsubstituted $C_6$-$C_{30}$ aryl group described above.

As used herein, the unsubstituted $C_1$-$C_{30}$ heteroaryl group (or a $C_1$-$C_{30}$ heteroaryl group) is a monovalent carbocyclic aromatic system having at least one aromatic ring and at least one of the heteroatoms selected from the group consisting of N, O, P, and S as a ring-forming atom. The unsubstituted $C_1$-$C_{30}$ heteroarylene group is a divalent carbocyclic aromatic system having at least one aromatic ring and at least one of the heteroatoms selected from the group consisting of N, O, P, and S. In this regard, when the heteroaryl group and the heteroarylene group have at least two rings, they may be fused to each other via a single bond. At least one hydrogen atom in the heteroaryl group and the heteroarylene group may be substituted with those substituents described with reference to the $C_1$-$C_{60}$ alkyl group.

Examples of the unsubstituted $C_1$-$C_{30}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the substituted or unsubstituted $C_1$-$C_{30}$ heteroarylene group may be inferred based on those examples of the substituted or unsubstituted $C_6$-$C_{30}$ arylene group described above.

The substituted or unsubstituted $C_6$-$C_{30}$ aryloxy group indicates —$OA_2$ (where $A_2$ is a substituted or unsubstituted $C_6$-$C_{30}$ aryl group described above). The substituted or unsubstituted $C_6$-$C_{30}$ arylthiol group indicates —$SA_3$ (where $A_3$ is a substituted or unsubstituted $C_6$-$C_{30}$ aryl group described above).

The following Examples and Comparative Examples are provided in order to highlight characteristics of one or more embodiments, but the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1: Preparation of Compound 1

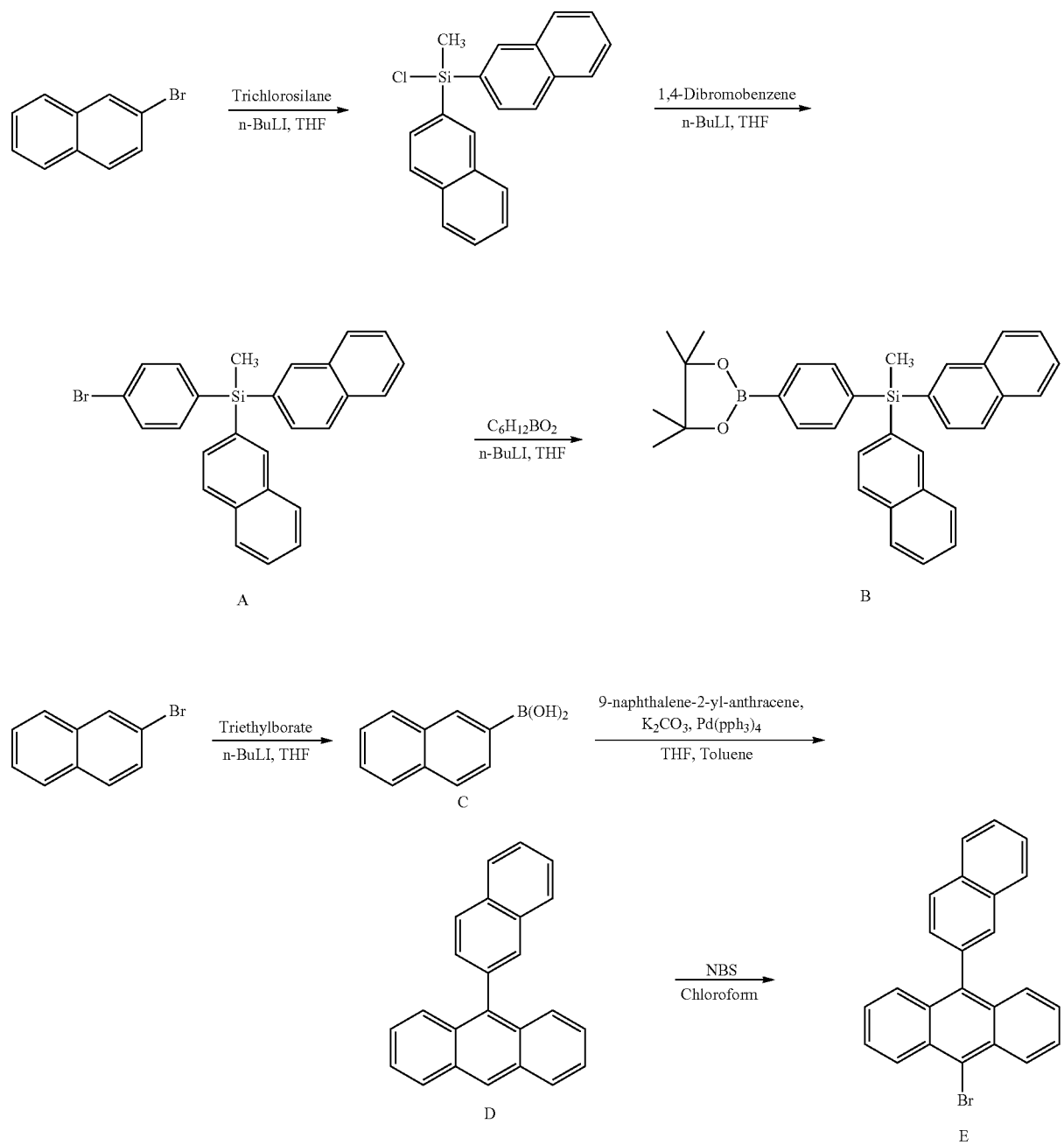

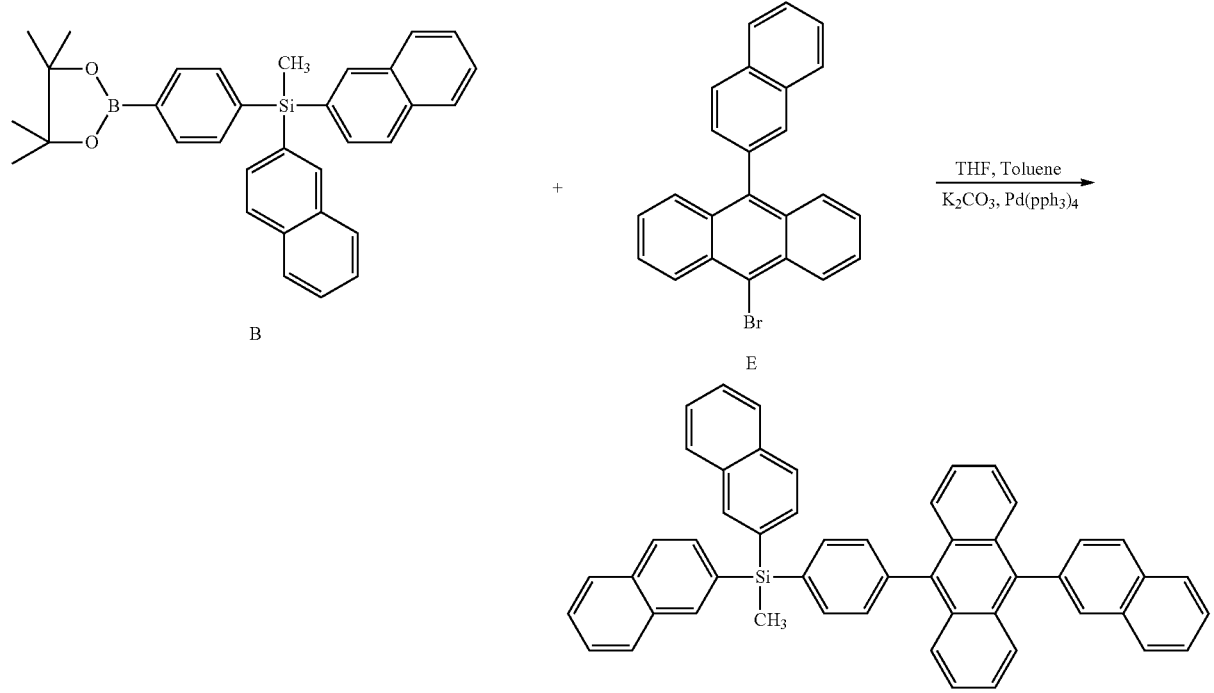

Synthesis of Compound A 15.0 g (96.6 mmol) of 2-bromonaphthalene and 100 mL of THF were put into a 250-mL three-necked flask in a nitrogen atmosphere, followed by cooling to about −78° C. Then, 29.44 mL (0.074 mmol) of n-BuLi (2.5 M in hexane) was slowly dropwise added thereto over 30 minutes. 5 g (0.0334 mol) of trichlorosilane was slowly added thereto at a temperature of about −80° C. or less, followed by increasing the temperature to between −10° C. and 0° C. and stirring for about 2 hours. 11.84 g (0.0502 mol) of 1,4-dibromobenzene was dissolved in THF in a 500-mL three-necked flask, and 20 mL (0.0502 mol) of n-BuLi was slowly added thereto at about −78° C., and maintained at the same temperature for about 1 hour. The reaction product in the 250-mL three-necked flask was added into the 500-mL three-necked flask at a temperature of about −78° C., and then reacted for about 12 hours. The resulting reaction product was quenched using water, and then extracted using dichloromethane. The resulting solution was distilled to remove the solvent. The residue was purified by column chromatography using hexane as an eluent, followed by recrystallization with hexane to obtain 10 g of Compound A (Yield: 65%). This compound was structurally identified using $^1$H-nuclear magnetic resonance (NMR). $^1$H-NMR (300 MHz, a $CD_2Cl_2$): δ 8.08 (s, 2H), 7.91-7.98 (m, 6H), 7.72 (S, 1H), 7.65-7.62 (m, 2H), 7.59-7.52 (m, 5H), 7.33-7.28 (t, 1H), 1.04 (S, 3H).

Synthesis of Compound B 10 g (0.022 mol) of Compound A was dissolved in THF in a 500-mL three-necked flask in a nitrogen atmosphere. 13.23 mL (0.033 mol) of n-BuLi was slowly added into the flask at a temperature of about −78° C., and maintained at the same temperature for about 30 minutes. 6.83 g (0.033 mol) of 2-isopropoxy-4,4,5,5-tetramethyl-1,3,2-dioxaborane was slowly added at a temperature of about −80° C., and then reacted for about 12 hours or longer. The resulting reaction product was quenched using ice water, and then extracted using ethyl acetate to obtain 5 g of Compound B (Yield: 48%). This compound was structurally identified using $^1$H-NMR. $^1$H-NMR (300 MHz, a $CD_2Cl_2$): δ 8.15-8.14 (d, 1H), 8.05-8.04 (d, 2H), 7.92-7.78 (m, 7H), 7.66-7.61 (m, 3H), 7.55-7.45 (m, 4H), 7.40-7.35 (t, 1H).

Preparation of Compound C 15 g (0.072 mol) of 2-bromonaphthalene and THF were put into a 500-mL three-necked flask, followed by cooling to about −78° C. Then, 43.46 mL (0.109 mol) of n-BuLi (2.5 M) was added thereto and stirred for about 1 hour, followed by adding 18.5 mL (0.109 mol) of triethyl borate and stirring for about 6 hours. A sufficient amount of a 2M HCl solution was added to terminate the reaction, followed by extraction with $CH_2Cl_2$ and water. Water was removed from the resulting solution, followed by drying to obtain 11.22 g of Compound C (Yield: 90%). This compound was structurally identified using $^1$H-NMR. $^1$H-NMR (300 MHz, a $CDCl_3$): δ 8.92 (m, 1H), 8.38-8.35 (m, 2H), 7.74-7.72 (t, 1H), 7.67-7.52 (m, 3H).

Preparation of Compound D 10 g (0.058 mol) of Compound C and 7.5 g (0.029 mol) of 9-naphthalene-2-yl-anthracene were put into a 250-mL three-necked flask, and dissolved with 100 mL of toluene and 20 mL of THF. 40 mL of a 2M $K_2CO_3$ solution was added thereto in a nitrogen atmosphere and vigorously stirred for about 30 minutes. 1.01 g (0.87 mmol) of $Pd(pph_3)_4$ was then added thereto, and reacted at about 100° C. for about 48 hours. HCl was added into the reaction product to terminate the reaction, followed by extraction with dichloromethane to obtain 12.8 g of Compound D (Yield: 69.1%). This compound was structurally identified using $^1$H-NMR. $^1$H-NMR (300 MHz, CD2Cl2): δ 8.59 (s, 1H), 8.14-8.05 (m, 4H), 7.96-7.93 (m, 2H), 7.71-7.68 (m, 2H), 7.64-7.57 (m, 3H), 7.54-7.48 (m, 2H), 7.39-7.34 (m, 2H).

Preparation of Compound E 9 g (29.57 mmol) of Compound D was put into a 250-ml three-necked flask, and dissolved with 108 mL of chloroform. The flask was wrapped with an aluminum foil to block out light, and then 7.37 g (41.40 mmol) of N-bromosuccinimide was added thereinto. After about 2 hours, water was added to terminate the reaction, followed by extraction with chloroform to obtain 9.65 g of Compound E (Yield: 85%). This compound was structurally identified using $^1$H-NMR. $^1$H-NMR (300 MHz, CD$_2$Cl$_2$): δ8.70-8.69 (d, 2H), 8.14-8.05 (m, 2H), 7.77-7.72 (t, 1H), 7.66-7.61 (m, 2H), 7.56-7.49 (m, 2H), 7.44-7.41 (d, 2H), 7.35-7.29 (m, 2H), 7.25-7.2 (m, 1H), 7.02-6.99 (d, 1H).

Synthesis of Compound 1

1.91 g (4.9 mmol) of Compound E and 3 g (5.9 mmol) of Compound B were put into a 250-mL three-necked flask and dissolved with toluene. 39 mL of a 2M NaOH solution was added thereto in a nitrogen atmosphere and vigorously stirred for about 30 minutes. 0.39 g (0.24 mmol) of Pd(pph$_3$)$_4$ was then added thereto, and reacted at about 100° C. for about 48 hours. HCl was added to terminate the reaction, followed by extraction with ethyl acetate and purification by sublimation to obtain 1.5 g of Compound 1 (Yield: 47%). This compound was structurally identified using $^1$H-NMR. $^1$H-NMR (300 MHz, a CDCl$_3$): δ 8.70-8.69 (d, 2H), 8.14-8.05 (m, 2H), 7.77-7.72 (t, 1H), 7.66-7.61 (m, 2H), 7.56-7.49 (m, 2H), 7.44-7.41 (d, 2H), 7.35-7.29 (m, 2H), 7.25-7.2 (m, 1H), 7.02-6.99 (d, 1H).

Synthesis Example 2: Preparation of Compound 2

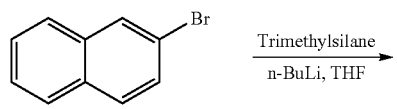

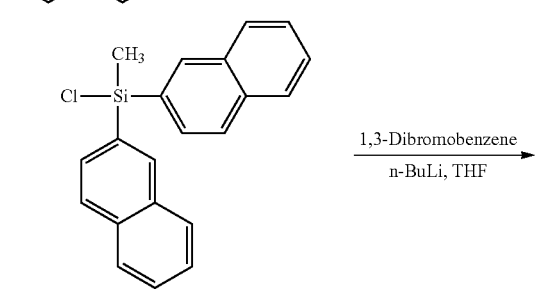

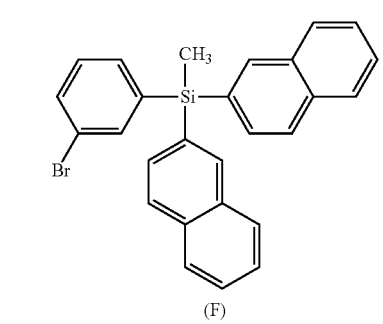

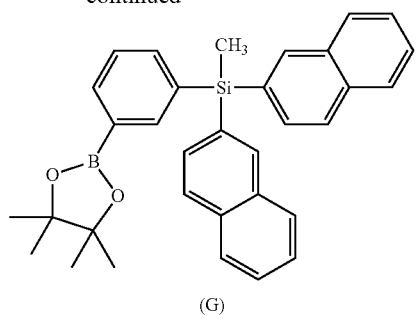

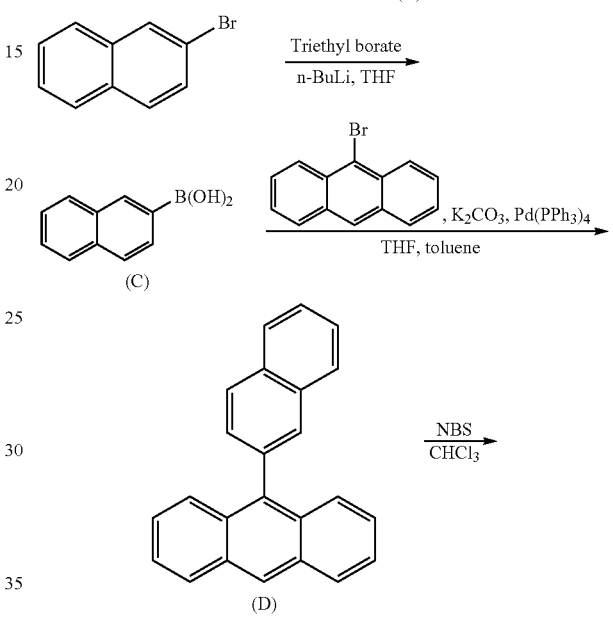

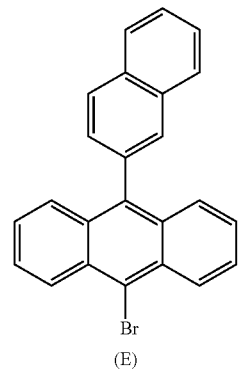

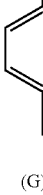

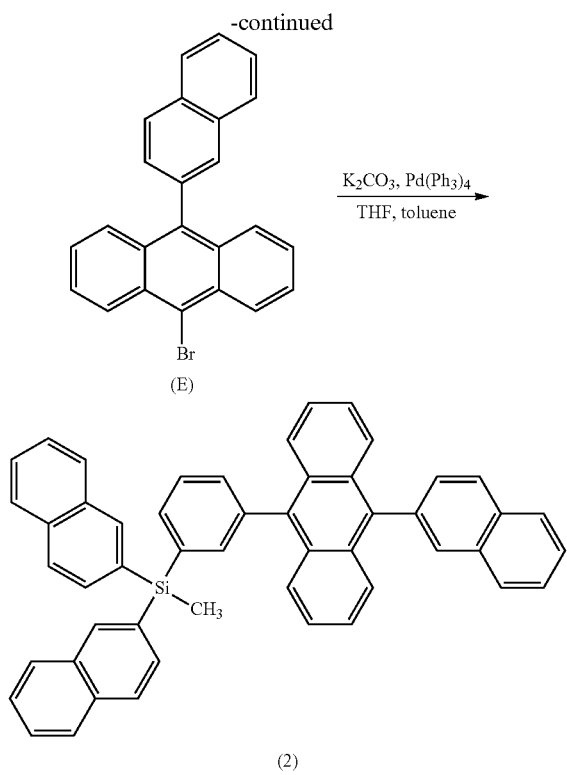

Preparation of Compound F 15 g (0.074 mol) of 2-bromonaphthalene was put into a 500 mL three-necked flask and dissolved with 180 mL of THF, followed by cooling to about −78° C. Then, 29.44 mL (0.074 mol) of n-BuLi (2.5 M in hexane) was slowly dropwise added thereto, and stirred for about 30 minutes. 5 g (0.0334 mol) of trichloromethyl silane was slowly dropwise added thereto at a temperature of about 80° C. or less, followed by increasing the temperature to between −10° C. and 0° C. and stirring for about 2 hours. 11.84 g (0.0502 mol) of 1,3-dibromobenzene was dissolved in 170 mL of THF in a 250-mL three-necked flask, and 20 mL (0.0502 mol) of n-BuLi (2.5 M in hexane) was slowly dropwise added thereinto at about −78° C., and stirred at the same temperature for about 1 hour. The reaction product in the 250-mL three-necked flask was added into the 500-mL three-necked flask at a temperature of about −78° C., and then reacted for about 12 hours. Water was added to terminate the reaction, followed by extraction with methylene chloride. An organic phase was collected, followed by removing the solvent from the organic phase. The resulting product was separated by column chromatography using hexane as an eluent, followed by recrystallization using hexane to obtain 10 g of Compound F (Yield: 65%). This compound was structurally identified using $^1$H-NMR. $^1$H-NMR (300 MHz, a $CD_2Cl_2$, ppm): δ=8.08 (s, 2H), 7.91-7.82 (m, 6H), 7.72 (m, 1H), 7.65-7.52 (m, 8H), 7.33-7.28 (t, 1H), 1.04 (s, 3H).

Preparation of Compound G 10 g (0.022 mol) of Compound F was dissolved in 300 mL of THF in a 500-mL three-necked flask. 13.23 mL (0.033 mol) of n-BuLi (2.5M in hexane) was slowly dropwise added thereto in a nitrogen atmosphere at a temperature of about −78° C., and maintained at the same temperature for about 30 minutes. 6.83 g (0.033 mol) of 2-isopropoxy-4,4,5,5-tetramethyl-1,3,2-dioxaborane was slowly added thereto at a temperature of about −80° C., and reacted for about 12 hours or longer. An organic phase was collected, followed by distillation to remove the solvent from the organic phase. The residue was separated by column chromatography using hexane as an eluent to obtain 5 g of Compound G (Yield: 48%). This compound was structurally identified using $^1$H-NMR. $^1$H-NMR (300 MHz, a $CD_2Cl_2$, ppm): δ=8.15 (s, 1H), 8.05 (1, 2H), 7.92-7.78 (m, 7H), 7.66-7.61 (m, 3H), 7.55-7.45 (m, 4H), 7.40-7.35 (m, 1H), 1.34 (s, 12H), 1.03 (s, 3H).

Preparation of Compound C 15 g (0.072 mol) of 2-bromonaphthalene and THF were put into a 500-mL three-necked flask, followed by cooling to about −78° C. Then, 43.46 mL (0.109 mol) of n-BuLi (2.5 M) was added thereto and stirred for about 1 hour, followed by adding 18.5 mL (0.109 mol) of triethyl borate and stirring for about 6 hours. A sufficient amount of a 2M HCl solution was added to terminate the reaction, followed by extraction with $CH_2Cl_2$ and water. Water was removed from the resulting solution, followed by drying to obtain 11.22 g of Compound C (Yield: 90%). This compound was structurally identified using $^1$H-NMR. $^1$H-NMR (300 MHz, a $CDCl_3$): δ 8.92 (m, 1H), 8.38-8.35 (m, 2H), 7.74-7.72 (t, 1H), 7.67-7.52 (m, 3H).

Preparation of Compound D 10 g (0.058 mol) of Compound C and 7.5 g (0.029 mol) of 9-naphthalene-2-yl-anthracene were put into a 250-mL three-necked flask and dissolved with 100 mL of toluene and 20 mL of THF. 40 mL of a 2M $K_2CO_3$ solution was added thereto in a nitrogen atmosphere and vigorously stirred for about 30 minutes. 1.01 g (0.87 mmol) of $Pd(pph_3)_4$ was added thereto and reacted at about 100° C. for about 48 hours. HCl was added to terminate the reaction, followed by extraction with dichloromethane to obtain 12.8 g of Compound D (Yield: 69.1%). This compound was structurally identified using $^1$H-NMR. $^1$H-NMR (300 MHz, $CD_2Cl_2$): δ 8.59 (s, 1H), 8.14-8.05 (m, 4H), 7.96-7.93 (m, 2H), 7.71-7.68 (m, 2H), 7.64-7.57 (m, 3H), 7.54-7.48 (m, 2H), 7.39-7.34 (m, 2H).

Preparation of Compound E 9 g (29.57 mmol) of Compound D was put into a 250-mL three-necked flask and dissolved with 108 mL of chloroform. The flask was wrapped with an aluminum foil to block out light, and then 7.37 g (41.40 mmol) of N-bromosuccinimide was added thereto. After about 2 hours, water was added to terminate the reaction, followed by extraction with chloroform to obtain 9.65 g of Compound E (Yield: 85%). This compound was structurally identified using $^1$H-NMR. $^1$H-NMR (300 MHz, a $CD_2Cl_2$): δ8.70-8.69 (d, 2H), 8.14-8.05 (m, 2H), 7.77-7.72 (t, 1H), 7.66-7.61 (m, 2H), 7.56-7.49 (m, 2H), 7.44-7.41 (d, 2H), 7.35-7.29 (m, 2H), 7.25-7.2 (m, 1H), 7.02-6.99 (d, 1H).

Synthesis of Compound 2

1.91 g (4.9 mmol) of Compound E and 3 g (5.9 mmol) of Compound G were put into a 250-mL three-necked flask and dissolved with 100 mL of toluene. 39 mL of a 2M NaOH was added thereto and vigorously stirred for about 30 minutes while bubbling nitrogen thereinto. 0.39 g (0.24 mmol) of $Pd(PPh_3)_4$ was then added thereto, and reacted at about 100° C. for about 48 hours. 100 mL of a 2M HCl solution was added to terminate the reaction, followed by extraction with ethyl acetate. The resulting product was separated by column chromatograph using hexane and $CH_2Cl_2$ as eluents to obtain 1.5 g of Compound 2 (Yield: 47%). This compound was structurally identified using $^1$H-NMR. $^1$H-NMR (300 MHz, a $CD_2Cl_2$, ppm): δ=8.18 (s, 2H), 8.13-8.05 (m, 2H), 7.99-7.79 (m, 13H), 7.76-7.68 (m, 5H), 7.64-7.59 (m, 3H), 7.56-7.51 (d, 4H), 7.41-7.29 (m, 4H), 1.09 (s, 3H).

Example 1

To manufacture an anode, a glass substrate with deposited ITO/Ag/ITO layers (70 Å/1000 Å/70 Å) was cut to a size of 50 mm×50 mm×0.5 mm and then ultrasonicated in isopropyl alcohol and pure water each for 10 minutes, and then cleaned by irradiation of ultraviolet rays for 10 minutes and exposure to ozone. The resulting glass substrate was loaded into a vacuum deposition device.

2-TNATA was deposited on the anode to form an HIL having a thickness of about 700 Å, and then Compound 311 represented by the following formula was deposited thereon to form an HTL having a thickness of about 500 Å. Compound 1 (host) and Compound 101 (dopant) represented by the following formula were co-deposited on the HTL in a weight ratio of 200:3 to form an EML having a thickness of about 200 Å. After Compound 201 represented by the following formula and lithium quinolate (LiQ) were co-deposited on the EML in a weight ratio of 5:5 to form an ETL having a thickness of about 300 Å, LiQ was deposited on the ETL to form an EIL having a thickness of about 10 Å, and then magnesium (Mg) and silver (Ag) were deposited on the EIL in a weight ratio of 130:10 to form a cathode having a thickness of about 130 Å, thereby completing the manufacture of an organic light-emitting device.

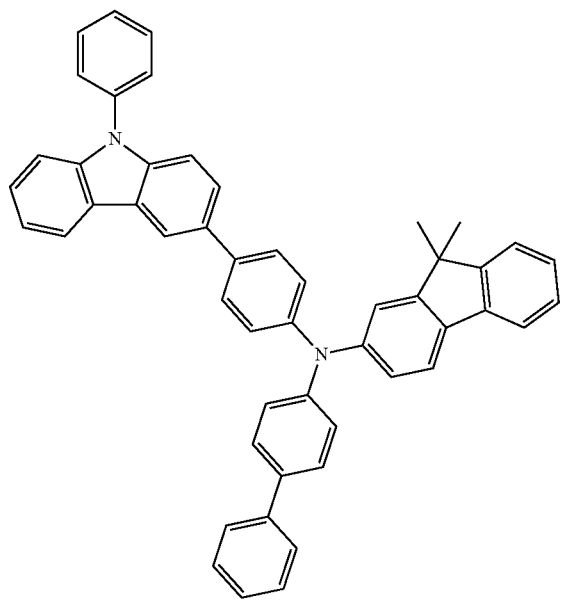

311

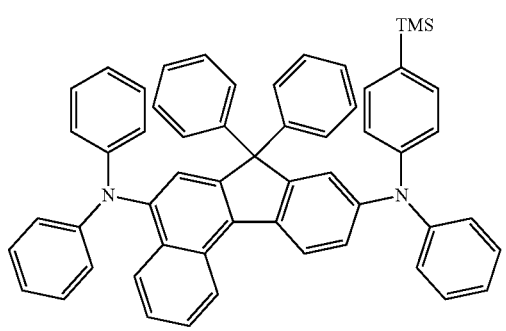

101

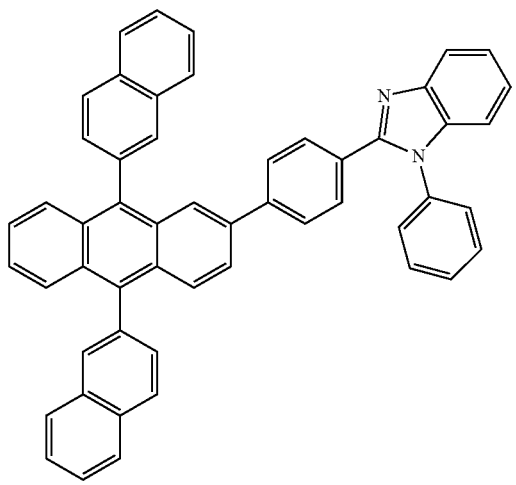

201

Example 2

An organic light-emitting device was manufactured in the same manner as in Example 1, except that Compound 2, instead of Compound 1, was used to form the EML.

Comparative Example

An organic light-emitting device was manufactured in the same manner as in Example 1, except that Compound X, instead of Compound 1, was used to form the EML.

<Compound X>

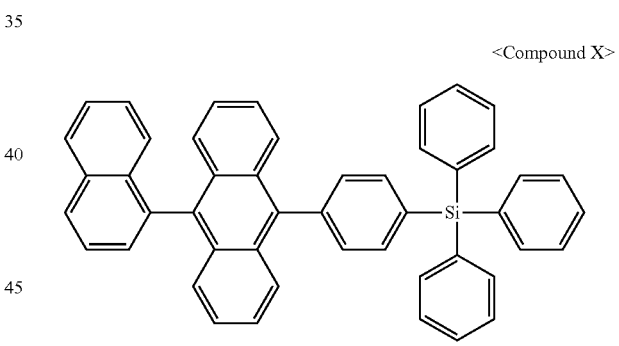

Evaluation Example 1

Figure 2:
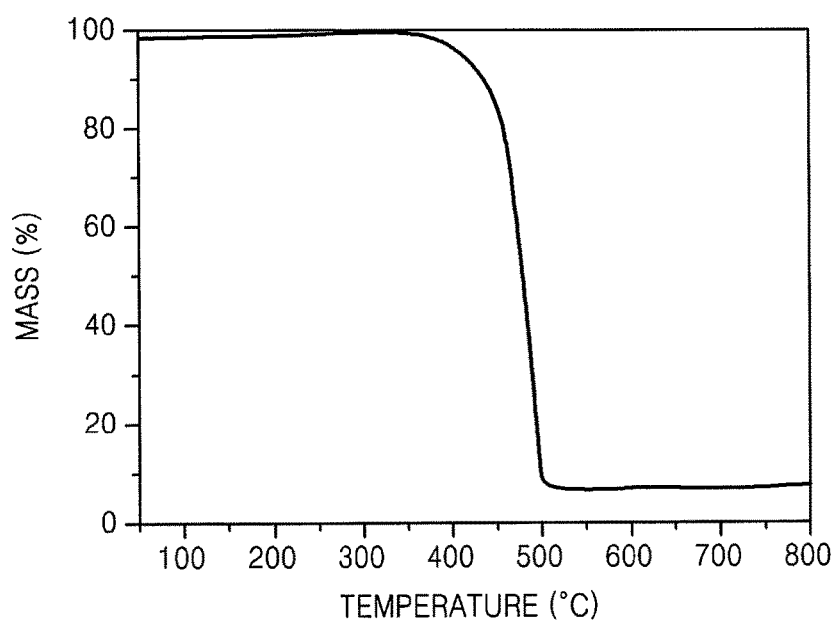
FIG. 2 illustrates a graph showing results of thermogravimetry analysis (TGA) on Compound 1.
Figure 3:
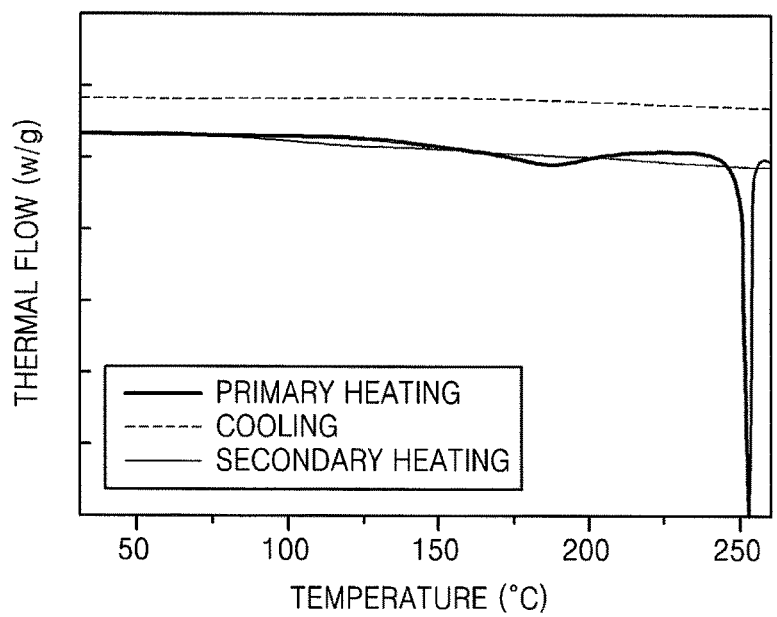
FIG. 3 illustrates a graph showing results of differential scanning calorimetry (DSC) on Compound 1.

Compounds 1 and 2 were analyzed by thermo gravimetric analysis (TGA) and differential scanning calorimetry (DSC) in which the temperature was increased from about 40° C. to about 800° C. at a rate of 10° C./min in a nitrogen atmosphere. The analysis results of Compounds 1 and 2 are shown in FIGS. 2 and 3. The temperatures at which Compounds 1 and 2 had a mass loss of about 5% were about 420° C. and 440° C., respectively. The analysis results indicate that the anthracene-based compound of Formula 1 has high thermal stability.

Evaluation Example 2

Figure 4:
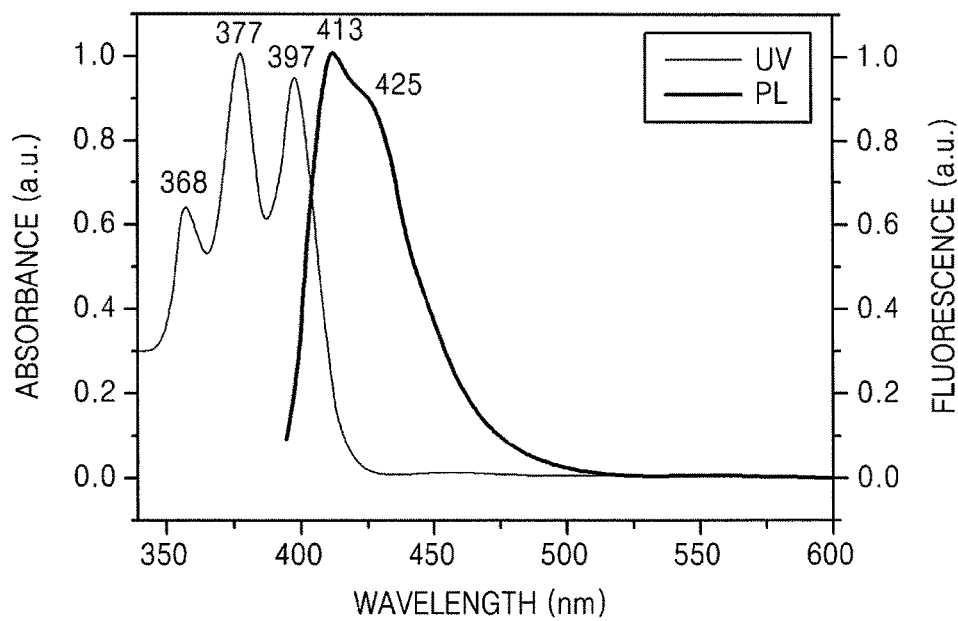
FIG. 4 illustrates a graph showing a UV absorption spectrum and a photoluminescence (PL) spectrum of Compound 1 in solution.
Figure 5:
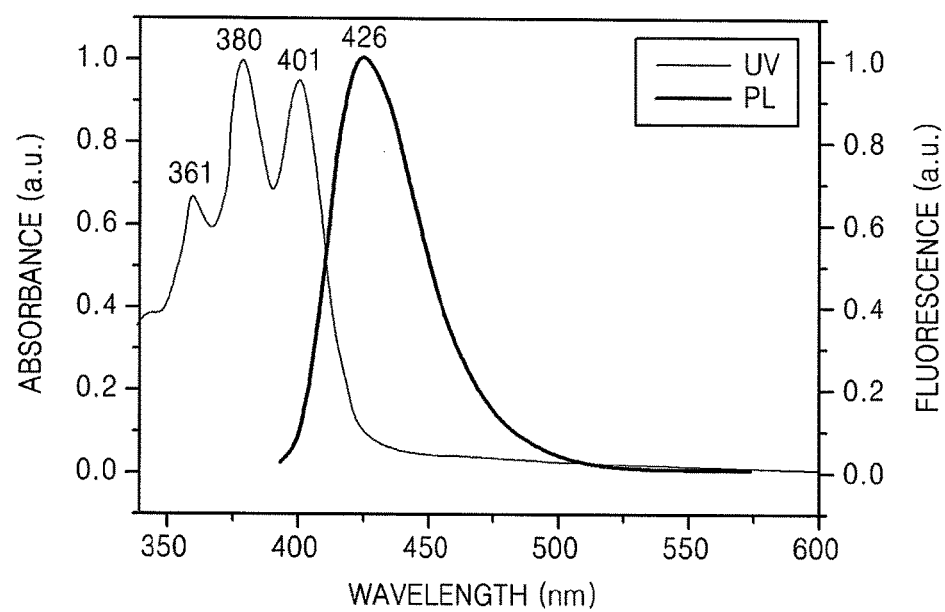
FIG. 5 illustrates a graph showing a UV absorption and a PL spectrum of Compound 1 in film form.

Compound 1 was dissolved at a concentration of $1\times10^{-5}$ M in chloroform solvent to obtain UV and photoluminescence (PL) spectra. The results are shown in FIG. 4. Compounds 1 had maximum peaks at about 413 nm and about 421 nm, respectively, in the PL spectra. The analysis results indicate that the PL spectra were changed depending on the position of a silyl substituent.

Evaluation Example 3

Driving voltages, current densities, luminance, emission colors, and efficiencies of the light-emitting devices of Examples 1 and 2 and Comparative Example were measured using a PR650 (Spectroscan) Source Measurement Unit. (available from Photo Research, Inc.). The results are shown in Table 1.

TABLE 1

| Example | EML material | Driving voltage (V) | Current density (mA/cm$^2$) | Luminance (cd/m$^2$) | Efficiency (cd/A) | Tg (° C.) | Emission color |
|---|---|---|---|---|---|---|---|
| Comparative Example | Compound X | 4.10 | 15.3 | 600 | 3.7 | 101 | Blue |
| Example 1 | Compound 1 | 4.00 | 14.3 | 600 | 5.5 | 189 | Blue |
| Example 2 | Compound 2 | 4.20 | 14.7 | 600 | 6.0 | — | Blue |

Referring to Table 1, the organic light-emitting device of Example 1 was found to have a higher efficiency by about 20% or more and higher thermal stability than the organic light-emitting device of Comparative Example 1.

By way of summation and review, an anthracene-based compound of Formula 1 may have high thermal stability and improved optical and chemical characteristics, and thus a high-quality blue organic light-emitting device may be manufactured using the anthracene-based compound of Formula 1. Thus, an anthracene-based compound and a high-quality organic light-emitting device including the anthracene-based compound are both provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An anthracene-based compound represented by Formula 1:

<Formula 1>

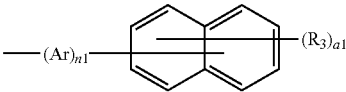

wherein, in Formula 1,
Ar$_1$ and Ar$_2$ are each independently selected from a substituted or unsubstituted C$_3$-C$_{30}$ cycloalkylene group, a substituted or unsubstituted C$_3$-C$_{30}$ cycloalkenylene group, a substituted or unsubstituted C$_6$-C$_{30}$ arylene group, a substituted or unsubstituted C$_1$-C$_{30}$ heterocycloalkylene group, a substituted or unsubstituted C$_1$-C$_{30}$ heterocycloalkenylene group, and a substituted or unsubstituted C$_1$-C$_{30}$ heteroarylene group;
n1 is 0 and n2 is an integer from 1 to 3;
R$_1$ and R$_2$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted C$_1$-C$_{30}$ alkyl group, a substituted or unsubstituted C$_2$-C$_{30}$ alkenyl group, a substituted or unsubstituted C$_2$-C$_{30}$ alkynyl group, a substituted or unsubstituted C$_3$-C$_{30}$ cycloalkyl group, a substituted or unsubstituted C$_1$-C$_{30}$ heterocycloalkyl group, a substituted or unsubstituted C$_3$-C$_{30}$ cycloalkenyl group, a substituted or unsubstituted C$_1$-C$_{30}$ heterocycloalkenyl group, a substituted or unsubstituted C$_6$-C$_{30}$ aryl group, and a substituted or unsubstituted C$_1$-C$_{30}$ heteroaryl group; provided that R$_1$ and R$_2$ are not naphthyl group at the same time,
R$_3$ to R$_5$ are each independently selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted C$_1$-C$_{30}$ alkyl group, a substituted or unsubstituted C$_2$-C$_{30}$ alkenyl group, a substituted or unsubstituted C$_2$-C$_{30}$ alkynyl group, a substituted or unsubstituted C$_3$-C$_{30}$ cycloalkyl group, a substituted or unsubstituted C$_1$-C$_{30}$ heterocycloalkyl group, a substituted or unsubstituted C$_3$-C$_{30}$ cycloalkenyl group, a substituted or unsubstituted C$_1$-C$_{30}$ heterocycloalkenyl group, a substituted or unsubstituted C$_6$-C$_{30}$ aryl group, and a substituted or unsubstituted C$_1$-C$_{30}$ heteroaryl group;
a1 and a3 are each independently an integer from 0 to 7; and
a2 is an integer from 0 to 8.

2. The anthracene-based compound as claimed in claim 1, wherein Ar$_2$ is selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spirofluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group.

3. The anthracene-based compound as claimed in claim 1, wherein $Ar_2$ is selected from
   i) a phenylene group, a naphthylene group, and an anthracenylene group; and
   ii) a phenylene group, a naphthylene group, and an anthracenylene group, each substituted with at least one selected from
   a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, and a $C_1$-$C_{30}$ alkyl group;
   a $C_1$-$C_{30}$ alkyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;
   a $C_6$-$C_{30}$ aryl group and a $C_1$-$C_{30}$ heteroaryl group; and
   a $C_6$-$C_{30}$ aryl group and a $C_1$-$C_{30}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, and a $C_1$-$C_{30}$ heteroaryl group.

4. The anthracene-based compound as claimed in claim 1, wherein $Ar_2$ is selected from
   i) a phenylene group, a naphthylene group, and an anthracenylene group; and
   ii) a phenylene group, a naphthylene group, and an anthracenylene group, each substituted with at least one selected from
   a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group; and
   a methyl group, an ethyl group, a n-propyl group, an iso-propyl group, a n-butyl group, a sec-butyl group, an iso-butyl group, and a tert-butyl group, each substituted with at least one of a deuterium atom, a halogen atom, a hydroxyl group, a cyano group, and a nitro group.

5. The anthracene-based compound as claimed in claim 1, wherein $Ar_2$ is selected from
   i) a phenylene group, a naphthylene group, and an anthracenylene group; and
   ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group.

6. The anthracene-based compound as claimed in claim 1, wherein n2 is 1 or 2.

7. The anthracene-based compound as claimed in claim 1, wherein $(Ar_2)_{n2}$ is one selected from groups represented by Formulae 3-1 to 3-11:

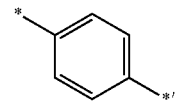

3-1

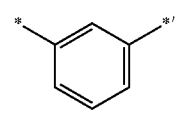

3-2

3-3 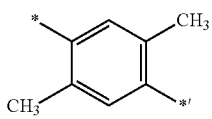

3-4 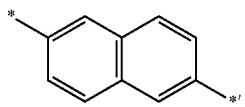

3-5 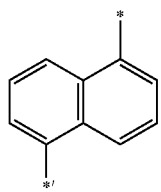

3-6 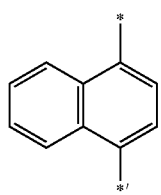

3-7 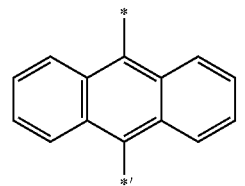

3-8 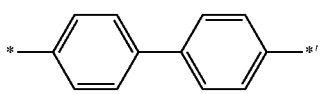

3-9 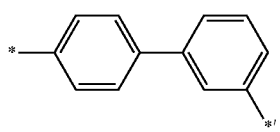

3-10 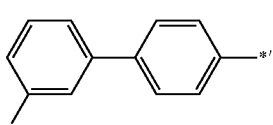

3-11 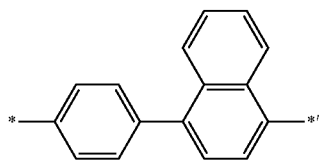

wherein, in Formulae 3-1 to 3-11, * indicates a binding site with an anthracene ring, and *' indicates a binding site with a silicon (Si) atom.

8. The anthracene-based compound as claimed in claim 1, wherein $R_1$ and $R_2$ are each independently selected from a deuterium atom, a halogen atom, a cyano group, a nitro group, a substituted or unsubstituted methyl group, a substituted or unsubstituted ethyl group, a substituted or unsubstituted n-propyl group, a substituted or unsubstituted i-propyl group, a substituted or unsubstituted n-butyl group, a substituted or unsubstituted iso-butyl group, a substituted or unsubstituted sec-butyl group, a substituted or unsubstituted tert-butyl group, a substituted or unsubstituted pentyl group, a substituted or unsubstituted hexyl group, a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, and a substituted or unsubstituted hexacenyl group.

9. The anthracene-based compound as claimed in claim 1, wherein $R_1$ and $R_2$ are each independently selected from
   i) a methyl group, an ethyl group, and an n-propyl group;
   ii) a methyl group, an ethyl group, and an n-propyl group, each substituted with a deuterium atom, a halogen atom, a cyano group, and a nitro group;
   iii) a phenyl group, a naphthyl group, and an anthryl group; and
   iv) a phenyl group, a naphthyl group, and an anthryl group, each substituted with at least one of a deuterium atom, a halogen atom, a cyano group, a nitro group, a methyl group, an ethyl group, and an n-butyl group.

10. The anthracene-based compound as claimed in claim 1, wherein $R_1$ and $R_2$ are each independently selected from a methyl group, an ethyl group, a phenyl group, and a 2-naphthyl group.

11. The anthracene-based compound as claimed in claim 1, wherein $R_3$ to $R_5$ are each independently selected from a deuterium atom, a halogen atom, a hydroxyl group, a cyano group, and a nitro group.

12. The anthracene-based compound as claimed in claim 1, wherein the anthracene-based compound of Formula 1 is a compound represented by Formula 1a or 1b:

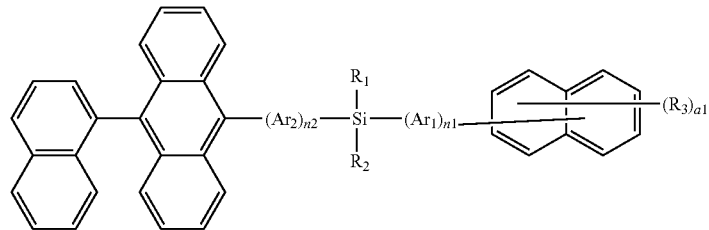

<Formula 1a>

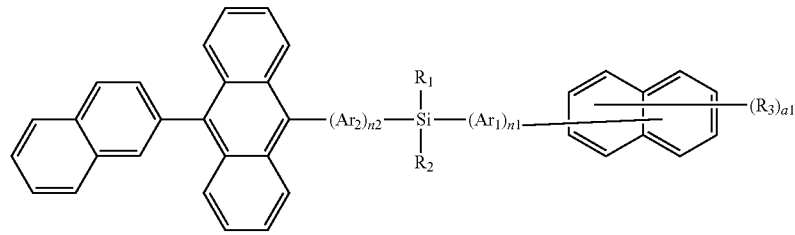

<Formula 1b> wherein, in Formulae 1a and 1b, $Ar_1$ and $Ar_2$ are each independently selected from i) a phenylene group, a naphthylene group, and an anthracenylene group, and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group;

n1 is 0 and n2 is 1 or 2; and $R_1$ and $R_2$ are each independently selected from i) a methyl group, an ethyl group, and an n-propyl group, ii) a methyl group, an ethyl group, and an n-propyl group, each substituted with a deuterium atom, a halogen atom, a cyano group, and a nitro group, iii) a phenyl group, a naphthyl group, and an anthryl group, and iv) a phenyl group, a naphthyl group, and an anthryl group, each substituted with at least one of a deuterium atom, a halogen atom, a cyano group, a nitro group, a methyl group, an ethyl group, and an n-butyl group;

$R_3$ is selected from a deuterium atom, a halogen atom, a hydroxyl group, a cyano group, and a nitro group; and a1 is an integer from 0 to 7.

13. The anthracene-based compound as claimed in claim 1, wherein the anthracene-based compound of Formula 1 is a compound represented by Formula 1a or 1b:

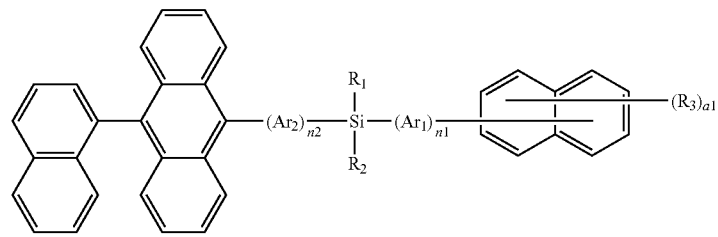

<Formula 1a>

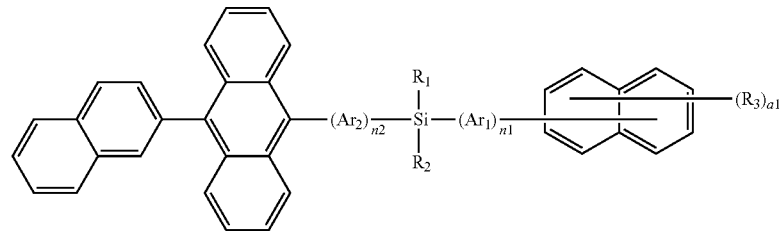

<Formula 1b> wherein, in Formulae 1a and 1b, $(Ar_1)_{n1}$ is a single bond and $(Ar_2)_{n2}$ is selected from groups represented by Formulae 3-1 to 3-11:

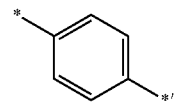

3-1

-continued 3-2 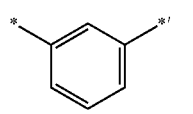

3-3 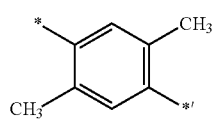

3-4 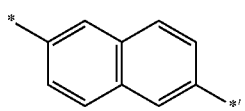

3-5 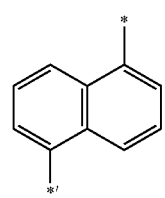

3-6 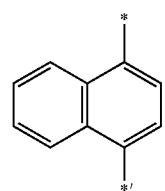

3-7 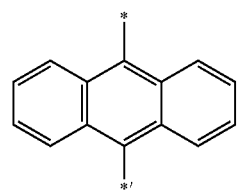

3-8 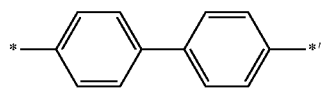

3-9 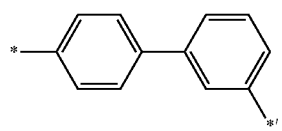

3-10 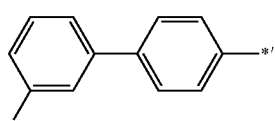

3-11 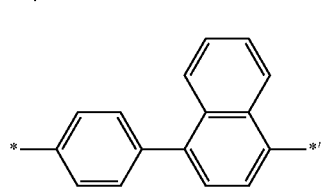

wherein, in Formulae 3-1 to 3-11,
* indicates a binding site with an anthracene ring, and
*' indicates a binding site with a silicon (Si) atom;

$R_1$ and $R_2$ are each independently selected from a methyl group, an ethyl group, a phenyl group, and a 2-naphthyl group;

$R_3$ is selected from a deuterium atom, a halogen atom, a hydroxyl group, a cyano group, and a nitro group; and a1 is an integer from 0 to 7.

14. The anthracene-based compound as claimed in claim 1, wherein the anthracene-based compound of Formula 1 is a compound represented by one selected from Formulae 1c to 1f:

<Formula 1c>

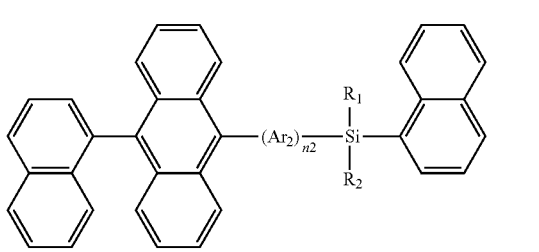

<Formula 1d>

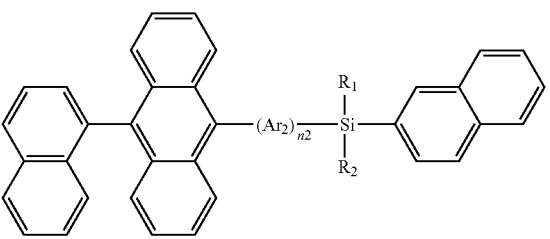

<Formula 1e>

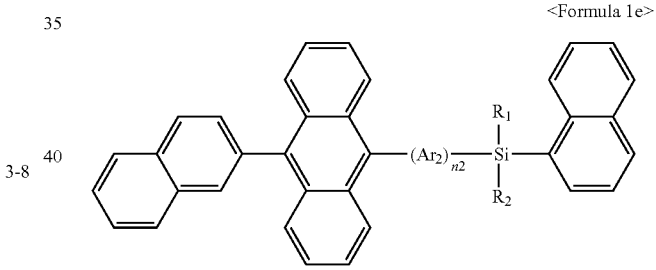

<Formula 1f>

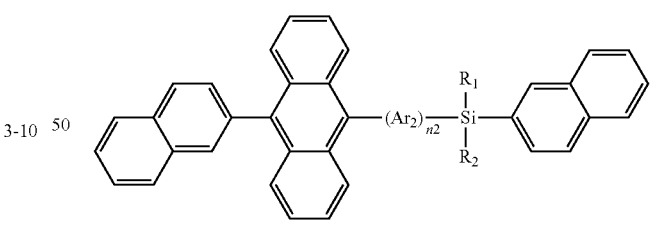

wherein, in Formulae 1c to 1f, $Ar_2$ is selected from i) a phenylene group, a naphthylene group, and an anthracenylene group, and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group;

n2 is an integer of 1 or 2; and $R_1$ and $R_2$ are each independently selected from i) a methyl group, an ethyl group, and an n-propyl group, ii) a methyl group, an ethyl group, and an n-propyl group, each substituted with a deuterium atom, a halogen atom, a cyano group, and a nitro group, iii) a phenyl group, a naphthyl group, and an anthryl group, and iv) a phenyl group, a naphthyl group, and an anthryl group, each substituted with at least one of a deuterium atom, a halogen atom, a cyano group, a nitro group, a methyl group, an ethyl group, and an n-butyl group.

15. The anthracene-based compound as claimed in claim 1, wherein the anthracene-based compound is a compound represented by one selected from Formulae 1c to 1f:

<Formula 1c>

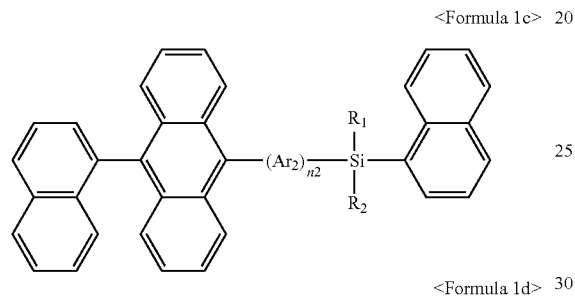

<Formula 1d>

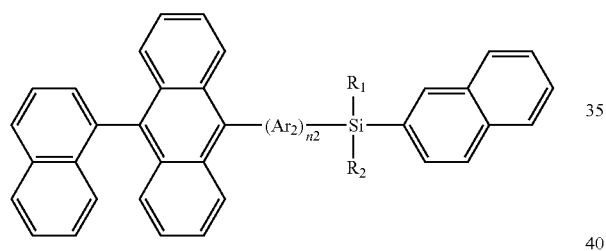

<Formula 1e>

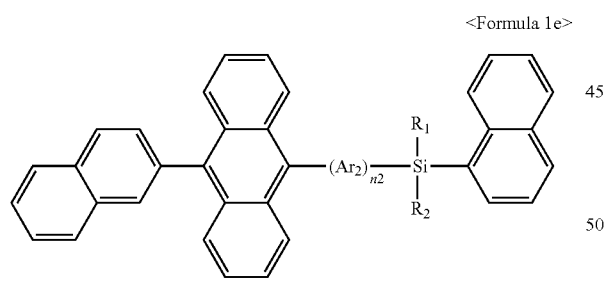

<Formula 1f>

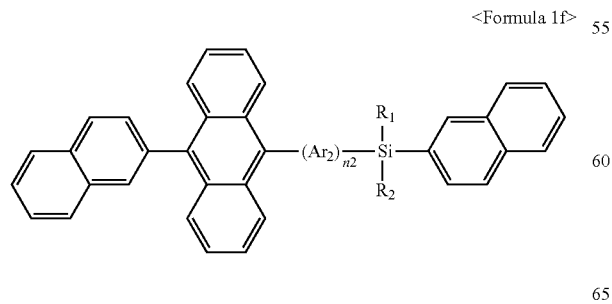

wherein, in Formulae 1c to 1f, $(Ar_2)_{n2}$ is a group represented by one selected from Formulae 3-1 to 3-11:

3-1
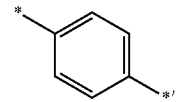

3-2
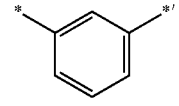

3-3
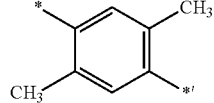

3-4
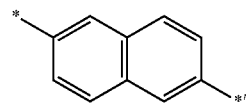

3-5
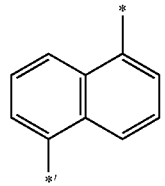

3-6
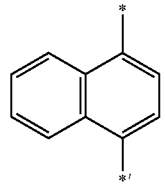

3-7
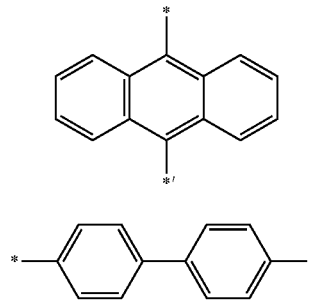

3-8
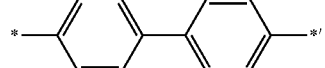

3-9
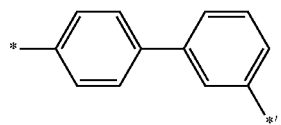

3-10
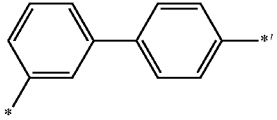

-continued

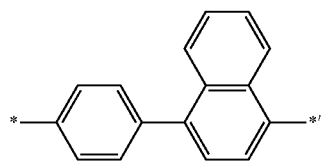

3-11 wherein, in Formulae 3-1 to 3-11,

\* indicates a binding site with an anthracene ring, and

\*' indicates a binding site with a silicon (Si) atom; and

5. $R_1$ and $R_2$ are each independently selected from a methyl group, an ethyl group, a phenyl group, and a 2-naphthyl group.

16. The anthracene-based compound as claimed in claim 1, wherein the anthracene-based compound is a compound selected from Compounds 1 to 9, 11 to 23, and 25 to 28:

<Compound 1> <Compound 2>

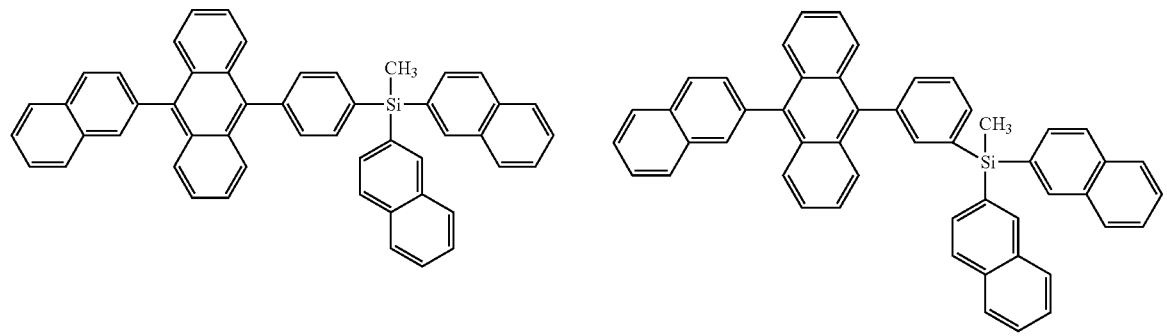

<Compound 3> <Compound 4>

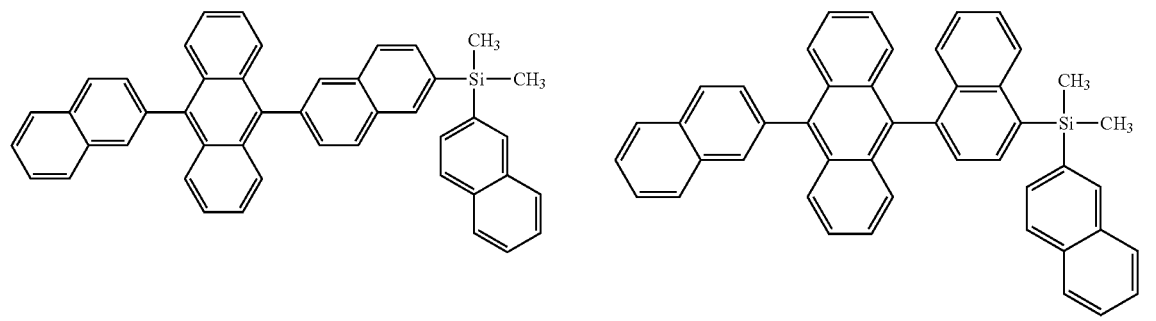

<Compound 5> <Compound 6>

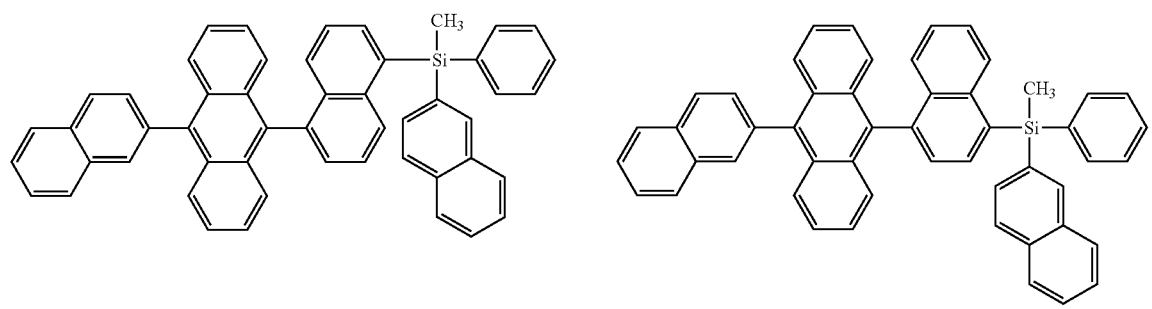

<Compound 7>
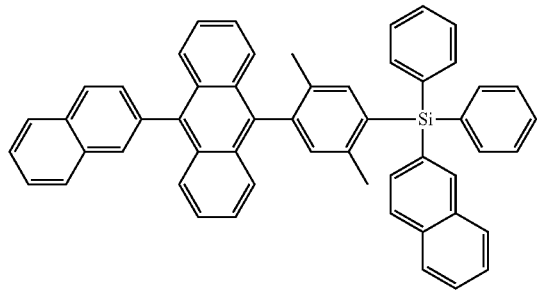
<Compound 8>
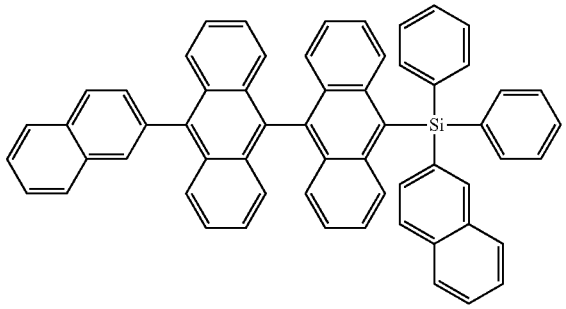
<Compound 9>
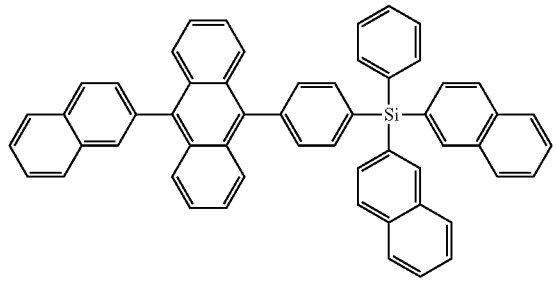
<Compound 11>
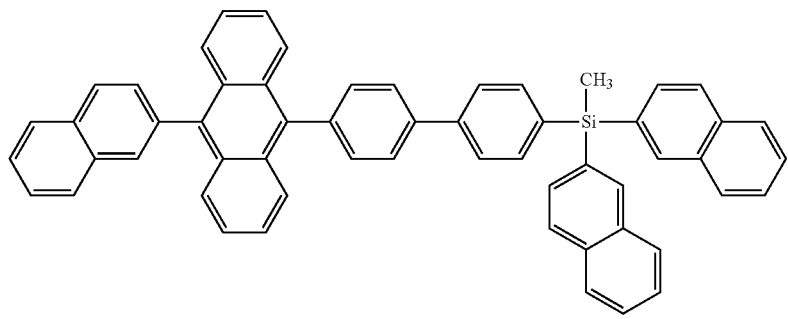
<Compound 12>
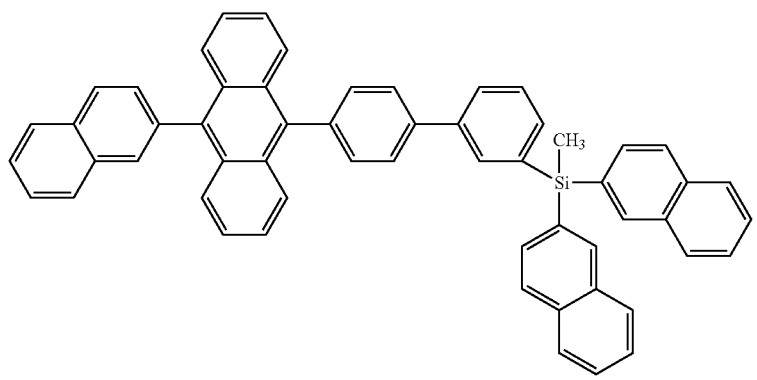

<Compound 13>
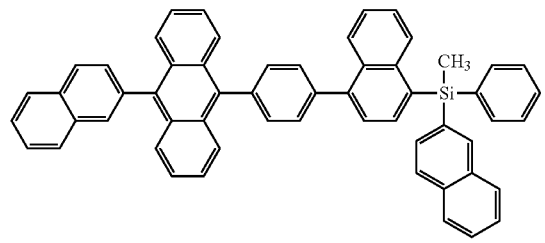
<Compound 14>
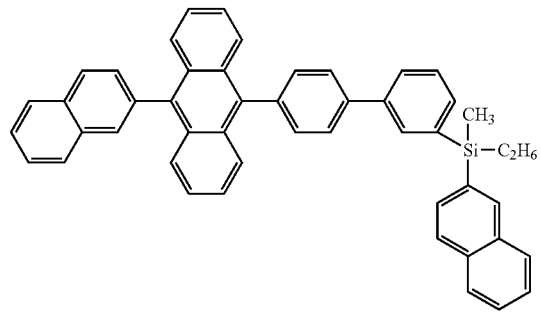
<Compound 15>
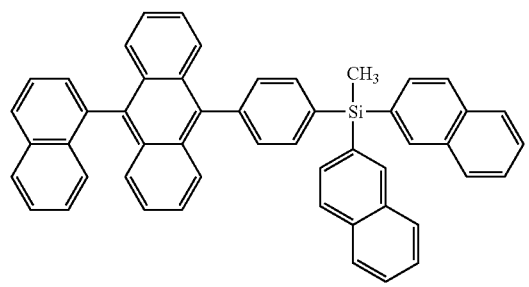
<Compound 16>
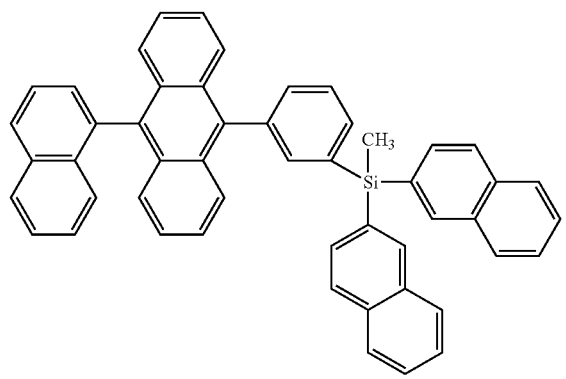
<Compound 17>
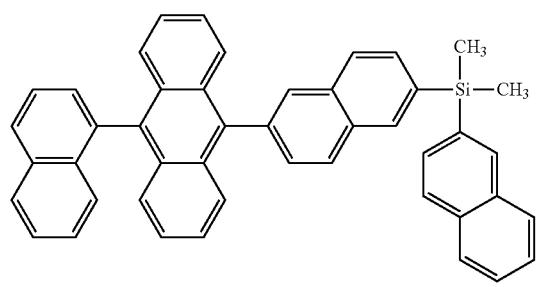
<Compound 18>
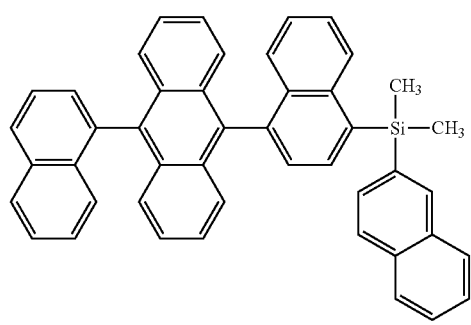

<Compound 19>
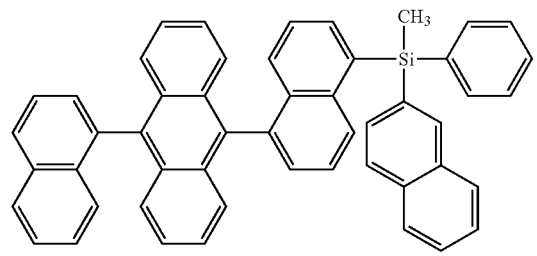
<Compound 20>
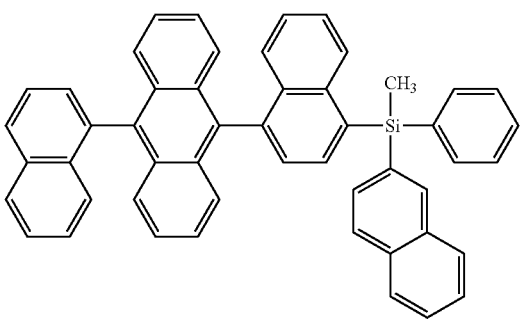
<Compound 21>
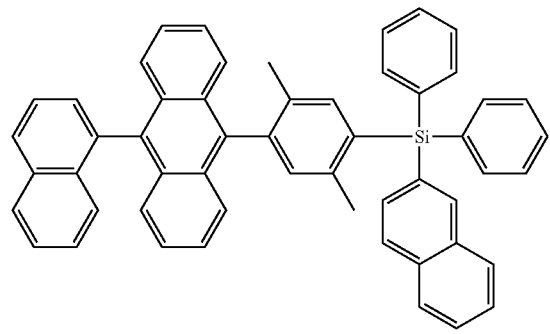
<Compound 22>
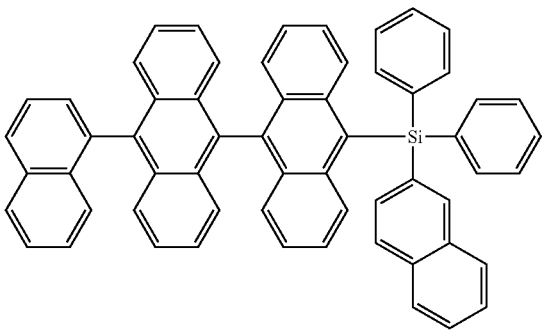
<Compound 23>
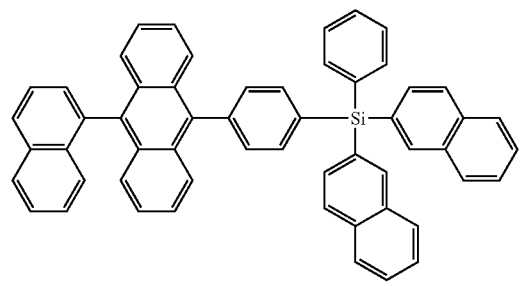

<Compound 25>

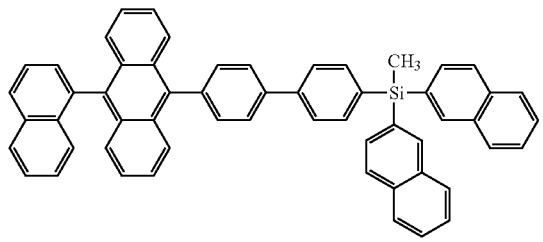

<Compound 26>

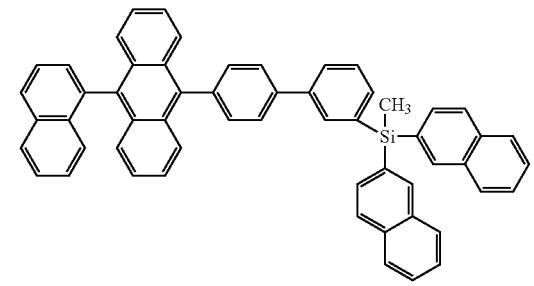

<Compound 27>

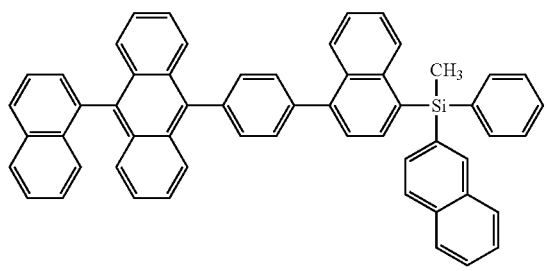

<Compound 28>

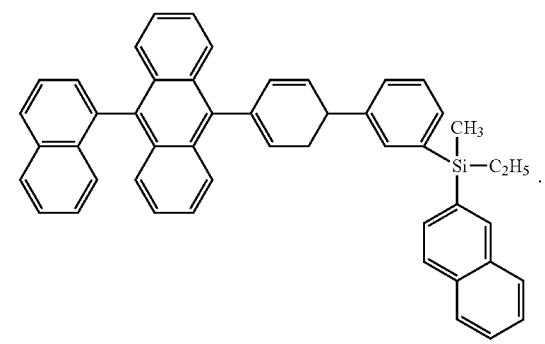

17. An organic light-emitting device comprising: a first electrode; a second electrode opposite to the first electrode; and an organic layer between the first and second electrodes and including an emission layer, wherein the organic layer includes at least one anthracene-based compound as claimed in claim 1.

18. The organic light-emitting device as claimed in claim 17, wherein the organic layer includes a hole transport region between the first electrode and the emission layer, and an electron transport region between the emission layer and the second electrode, the hole transport region including at least one of a hole injection layer, a hole transport layer, a functional layer having both hole injection and hole transport capabilities, a buffer layer, and an electron blocking layer, and the electron transport region including at least one of a hole blocking layer, an electron transport layer, and an electron injection layer.

19. The organic light-emitting device as claimed in claim 17, wherein the at least one anthracene-based compound is present in the emission layer.

20. The organic light-emitting device as claimed in claim 19, wherein the emission layer further includes a dopant represented by Formula 100, and the at least one anthracene-based compound is a host:

<Formula 100>

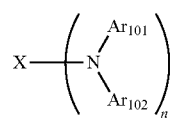

wherein, in Formula 100,

X is selected from i) a naphthalenyl group, a phenanthrenyl group, a pyrenyl group, an anthracenyl group, a chrysenyl group, a fluorenyl group, and a benzofluorenyl group, and ii) a naphthalenyl group, a phenanthrenyl group, a pyrenyl group, an anthracenyl group, a chrysenyl group, a fluorenyl group, and a benzofluorenyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, and a $C_1$-$C_{30}$ heteroaryl group;

$Ar_{101}$ and $Ar_{102}$ are each independently selected from i) a $C_6$-$C_{30}$ aryl group, and ii) a $C_6$-$C_{30}$ aryl group substituted with at least one selected from a deuterium atom, a halogen atom, a hydroxyl group, a cyano group, a nitro group, an amino group, amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, a $C_1$-$C_{30}$ heteroaryl group, and —$Si(Q_1)(Q_2)(Q_3)$, where $Q_1$ to $Q_3$ are each independently selected from a $C_1$-$C_{30}$ alkyl group, and a $C_6$-$C_{30}$ aryl group; and n is an integer from 1 to 4.

* * * * *